(12) United States Patent
Yu et al.

(10) Patent No.: US 10,559,264 B2
(45) Date of Patent: Feb. 11, 2020

(54) DISPLAY PANEL

(71) Applicant: LG DISPLAY CO., LTD., Seoul (KR)

(72) Inventors: Jaesung Yu, Seoul (KR); Seonyeong Kim, Seoul (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 16/176,400

(22) Filed: Oct. 31, 2018

(65) Prior Publication Data

US 2019/0130843 A1 May 2, 2019

(30) Foreign Application Priority Data

Oct. 31, 2017 (KR) .......................... 10-2017-0143919

(51) Int. Cl.
*G09G 3/3266* (2016.01)
*H01L 27/32* (2006.01)
(Continued)

(52) U.S. Cl.
CPC ....... *G09G 3/3266* (2013.01); *H01L 27/3279* (2013.01); *G09G 3/3275* (2013.01);
(Continued)

(58) Field of Classification Search
CPC ... G09G 2300/0809; G09G 2300/0861; G09G 2310/0243; G09G 2310/0262; G09G 2310/0281; G09G 2310/08; G09G 2320/0233; G09G 3/3233; G09G 3/3266; G09G 3/3275; H01L 27/124; H01L 27/1255; H01L 27/3279
See application file for complete search history.

(56) References Cited

U.S. PATENT DOCUMENTS 10,388,228 B2 * 8/2019 Kim .................... G09G 3/3233
2008/0084365 A1 * 4/2008 Takahara ............... G09G 3/006
345/76
(Continued)

FOREIGN PATENT DOCUMENTS

KR 100796397 B1 1/2008
KR 101152445 B1 6/2012
(Continued)

*Primary Examiner* — Dmitriy Bolotin
(74) *Attorney, Agent, or Firm* — Polsinelli PC

(57) ABSTRACT

A display panel having a display area where an image is displayed and a non-display area outside the display area, comprising first and second gate drive units disposed in a first outer area and a second outer area of the non-display area corresponding to both sides of the display area in a horizontal direction. Here, the first gate drive unit disposed in the first outer area includes a first signal block supplying a first drive control signal to respective horizontal lines having pixels, which are arranged successively in the horizontal direction, of the plurality of pixels and a second signal block supplying a second drive control signal having pulses different from those of the first drive control signal to the respective horizontal lines, and the second gate drive unit disposed in the second outer area includes the second signal block and a third signal block supplying a third drive control signal having pulses different from those of the first and second drive control signals to the respective horizontal lines.

24 Claims, 15 Drawing Sheets

(51) Int. Cl.
*H01L 27/12* (2006.01)
*G09G 3/3275* (2016.01)
(52) U.S. Cl.
CPC ............ *G09G 2300/0809* (2013.01); *G09G 2310/0243* (2013.01); *G09G 2310/0281* (2013.01); *G09G 2310/08* (2013.01); *G09G 2320/0233* (2013.01); *H01L 27/124* (2013.01); *H01L 27/1255* (2013.01)

(56) References Cited

U.S. PATENT DOCUMENTS

| | | | |
|---|---|---|---|
| 2012/0212517 A1* | 8/2012 | Ahn | G11C 19/28 345/690 |
| 2017/0301280 A1* | 10/2017 | Ka | G09G 3/2092 |
| 2017/0337877 A1* | 11/2017 | Kim | G09G 3/3225 |
| 2017/0345367 A1* | 11/2017 | Ka | G09G 3/3233 |
| 2018/0082630 A1* | 3/2018 | Kim | G09G 3/3233 |
| 2018/0190190 A1* | 7/2018 | Xi | G09G 3/3225 |
| 2019/0130825 A1* | 5/2019 | Pyo | G09G 3/3225 |

FOREIGN PATENT DOCUMENTS

| | | |
|---|---|---|
| KR | 101352322 B1 | 1/2014 |
| KR | 10-2017-0081078 | 7/2017 |

\* cited by examiner

DISPLAY PANEL

CROSS-REFERENCE TO RELATED APPLICATION

This application claims the benefit of the Korean Patent Application No. 10-2017-0143919, filed on Oct. 31, 2017, in the Korean Intellectual Property Office, the disclosure of which is incorporated herein in its entirety by reference.

BACKGROUND

Field of the Disclosure

The present disclosure relates to a display panel having a gate drive unit.

Description of the Background

Display devices are applied in various electronic devices such as a television (TV), a portable phone, a laptop computer, and a tablet, etc. So, much effort has been made in order to reduce thickness, weight, and power consumption of the display devices.

Representative examples of the display devices include a liquid crystal display device (LCD), a plasma display device (PDP), a field emission Display device (FED), an electro-luminescence Display device (ELD), an electro-Wetting Display device (EWD), and an organic light emitting display device (OLED), etc.

Generally, the display device includes a display panel including a display area where an image is displayed and a non-display area outside the display area, and a drive unit for driving the display panel.

The display panel can include a plurality of pixels corresponding to a plurality of pixel areas defined in the display area, a scan line corresponding to respective horizontal lines including pixels arranged in a horizontal direction, and a data line corresponding to respective vertical lines including pixels arranged in a vertical direction. Here, the plurality of pixel areas can be defined in the display area corresponding to intersections between the scan lines and the data lines.

The drive unit can include a gate drive unit for supplying a drive control signal to the respective horizontal lines, a data drive unit for supplying a data signal and a source signal to the respective vertical lines, and a timing controller for controlling the drive timing of the gate drive unit and the data drive unit.

Here, the gate drive unit is provided to supply drive control signals sequentially to at least two horizontal lines, and it is generally implemented in a structure simpler than that of the data drive unit.

Therefore, in contrast to the data drive unit, which is implemented as an integrated circuit (IC) chip mounted on a separate circuit board connected with the display panel, the gate drive unit can be implemented as a circuit embedded in the display panel. By using this structure, the structure of the display device can be simplified, which results in a simple manufacturing process as well as reduction in manufacture time and cost.

On the other hand, when the gate drive unit is embedded in the display panel, the size of the non-display area is increased because of the gate drive unit. Therefore, the width of a bezel cannot be decreased over a predetermined limit.

Also, a line resistance of the display device increases as the size gets bigger, and the line resistance can incur a signal distortion. Therefore, brightness on specific areas on the display panel can vary.

In order to prevent this, the gate drive unit can be disposed at areas of the non-display area of the display panel corresponding to both sides of the display area in the horizontal direction. By doing so, the area where the signal distortion occurs due to the line resistance is decreased since the drive control signal can be supplied from both sides of the scan line, which results in the reduction in the brightness difference among respective areas. On the other hand, the width of the bezel of the display device is increased since the area on which the gate drive unit is disposed is almost doubled.

More specifically, the organic light emitting display device can include a compensation circuit for compensating for a threshold voltage of the threshold voltage which supplies a drive current to the organic light emitting device. In this case, the number of drive control signals is increased since a separate drive control signal for driving the compensation circuit should be supplied to the respective pixels. Therefore, the structure of the gate drive unit gets complicated and the size of the area on which the gate drive unit is disposed is increased because of the compensation circuit.

In addition, the width of the bezel can be greatly increased due to the gate drive unit since two gate drive units are disposed at both sides of the display area in order to prevent brightness difference among respective areas.

SUMMARY

The present disclosure is to provide a display panel which can minimize the brightness difference among respective areas while decreasing the width of the gate drive unit.

In addition, the present disclosure are not limited to the objective mentioned in the above, and other objectives and advantages of the present disclosure can be understood based on the description in the following and more clearly understood based on the aspects of the present disclosure. In addition, it will be apparent that the objectives and advantages of the present disclosure can be realized by the means set forth in the claims and a combination thereof.

An aspect of the present disclosure provides a display panel having a display area where an image is displayed and a non-display area outside the display area, comprising a plurality of pixels corresponding to a plurality of pixel areas defined in the display area, and first and second gate drive units disposed in a first outer area and a second outer area of the non-display area corresponding to both sides of the display area in a horizontal direction.

Here, the first gate drive unit disposed in the first outer area includes a first signal block supplying a first drive control signal to respective horizontal lines having pixels, which are arranged successively in the horizontal direction, of the plurality of pixels and a second signal block supplying a second drive control signal having pulses different from those of the first drive control signal to the respective horizontal lines, and the second gate drive unit disposed in the second outer area includes the second signal block and a third signal block supplying a third drive control signal having pulses different from those of the first and second drive control signals to the respective horizontal lines.

The first and second drive control signals are supplied at respective turn-on levels during a predetermined period by the first and second signal blocks, and the second drive control signal is changed to a turn-off level earlier than the first drive control signal before the predetermined period expires. Here, the third drive control signal is supplied at the turn-off level during the predetermined period.

A pixel of the plurality of pixels which is disposed in an $i^{th}$ horizontal line (i is a natural number greater than or equal to 1 and smaller than or equal to N, where N is the number of the horizontal lines) can comprise: an organic light emitting device; a first thin film transistor which is connected in series with the organic light emitting device between a first driving source line supplying a first driving source to the plurality of pixels and a second driving source line supplying a second driving source lower than the first driving source to the plurality of pixels; a second thin film transistor which is disposed between a first node, which is connected with one of first and second electrodes of the first thin film transistor corresponding to the first driving source line, and a second node which is connected with a gate electrode of the first thin film transistor; a storage capacitor which is disposed between the second node and a third node which is connected with an anode electrode of the organic light emitting device; a third thin film transistor which is disposed between an initialization source line supplying an initialization source to the plurality of pixels and the third node; fourth and fifth thin film transistors which are disposed between a data line supplying a data signal to the plurality of pixels and a fourth node which is connected with the other of the first and second electrodes of the first thin film transistor; a sixth thin film transistor which is disposed between the fourth node and the organic light emitting device; and a seventh thin film transistor which is disposed between the first driving source line and the first node.

Here, the second thin film transistor is made in a conduction type different from those of the third, fourth, fifth, sixth, and seventh thin film transistors, the second thin film transistor is turned on based on an $i^{th}$ sampling scan signal, and the third thin film transistor is turned on based on an $i^{th}$ switching scan signal. And, one of the fourth and fifth thin film transistors is turned on based on an $i^{th}$ switching scan signal while the other is turned on based on an $i+1^{th}$ switching scan signal. In this case, one of the first and second drive control signals is a sampling scan signal for respective horizontal lines while the other is a switching scan signal for respective horizontal lines.

During a period when the data signal is supplied to the one pixel, the $i^{th}$ sampling scan signal and the $i^{th}$ switching scan signal are supplied at respective turn-on levels, and when the $i^{th}$ sampling scan signal is changed to the turn-off level earlier than the $i^{th}$ switching scan signal before the period when the data signal is supplied is expired, the first signal block supplies switching scan signals for the respective horizontal lines, and the second signal block supplies sampling scan signals for the respective horizontal lines.

Alternatively, during a period when the data signal is supplied to the one pixel, the $i^{th}$ sampling scan signal and the $i^{th}$ switching scan signal are supplied at turn-on levels, and when the $i^{th}$ switching scan signal is changed to the turn-off level earlier than the $i^{th}$ sampling scan signal before the period when the data signal is supplied is expired, the first signal block supplies sampling scan signals for the respective horizontal lines, and the second signal block supplies switching scan signals for the respective horizontal lines.

The sixth thin film transistor is turned on based on an $i^{th}$ emission signal, the seventh thin film transistor is turned on based on an $i+1^{th}$ emission signal, and a third drive control signal supplied by the third signal block is an emission signal for the respective horizontal lines.

Here, the third signal block of the second gate drive unit can be disposed in an area smaller than that for the first signal block of the first gate drive unit, and the second signal block of the second gate drive unit can be disposed in an area greater than that for the second signal block of the first gate drive unit.

The second signal block includes a buffer unit which corresponds to the respective horizontal lines, and the buffer unit of the second signal block of the second gate drive unit can be disposed in an area greater than that for the buffer unit of the second signal block of the first gate drive unit.

The buffer unit includes first and second buffer transistors which are connected in series between a first gate driving source and a second gate driving source lower than the first gate driving source, and the first and second buffer transistors provided in the second signal block of the second gate drive unit can have channel widths wider than those of first and second buffer transistors provided in the second signal block of the first gate drive unit.

The second signal block of each of the first and second gate drive units inverts an output signal of the first signal block according to a predetermined clock signal for generating a second drive control signal to generate the second drive control signal, and can output the second drive control signal to the respective horizontal lines based on a predetermined synchronization signal.

The display panel according to an aspect of the present disclosure includes first and second gate drive units which supply a plurality of drive control signals to the respective horizontal lines and are disposed in first and second outer areas of the non-display area corresponding to both sides of the display area. Here, the first gate drive unit includes first and second signal blocks corresponding to the first and second drive control signals and the second gate drive unit includes second and third signal blocks corresponding to the second and third drive control signals.

Similarly, since the first and second gate drive units do not include all of the first, second and third signal blocks corresponding to the first, second and third drive control signals, the first and second gate drive units which are disposed in the first and second outer areas of the non-display area corresponding to both sides of the display area are simplified, which prevents a width of the bezel of the display device from being increased due to the first and second gate drive units.

In addition, one of the first, second and third drive control signals which incurs greatest brightness difference among respective areas due to signal distortion, that is the second drive control signal, is supplied from both sides of the second signal block provided in the first and second gate drive units. Therefore, the brightness difference among respective areas can be minimized.

DETAILED DESCRIPTION

The objectives, features, and advantages will be explained in detail by referring to the appended figures, such that a skilled person in the art to which the present disclosure pertains can readily practice the technical spirit of the present disclosure. Also, in the explanation on the present disclosure in the following, detailed explanations on related known technique will be omitted when it is determined that they will unnecessarily obscure the subject matter of the present disclosure. In the following, aspects of the present disclosure will be described in detail by referring to appended figures. In the figures, same reference symbols are used to refer to the same or similar components.

In the following, the display panel according to aspects of the present disclosure will be explained in detail by referring to the appended figures.

At first, by referring to FIG. 1 and FIG. 2, the organic light emitting display device according to the first aspect of the present disclosure, and a display panel included in the display device will be explained.

Figure 1:
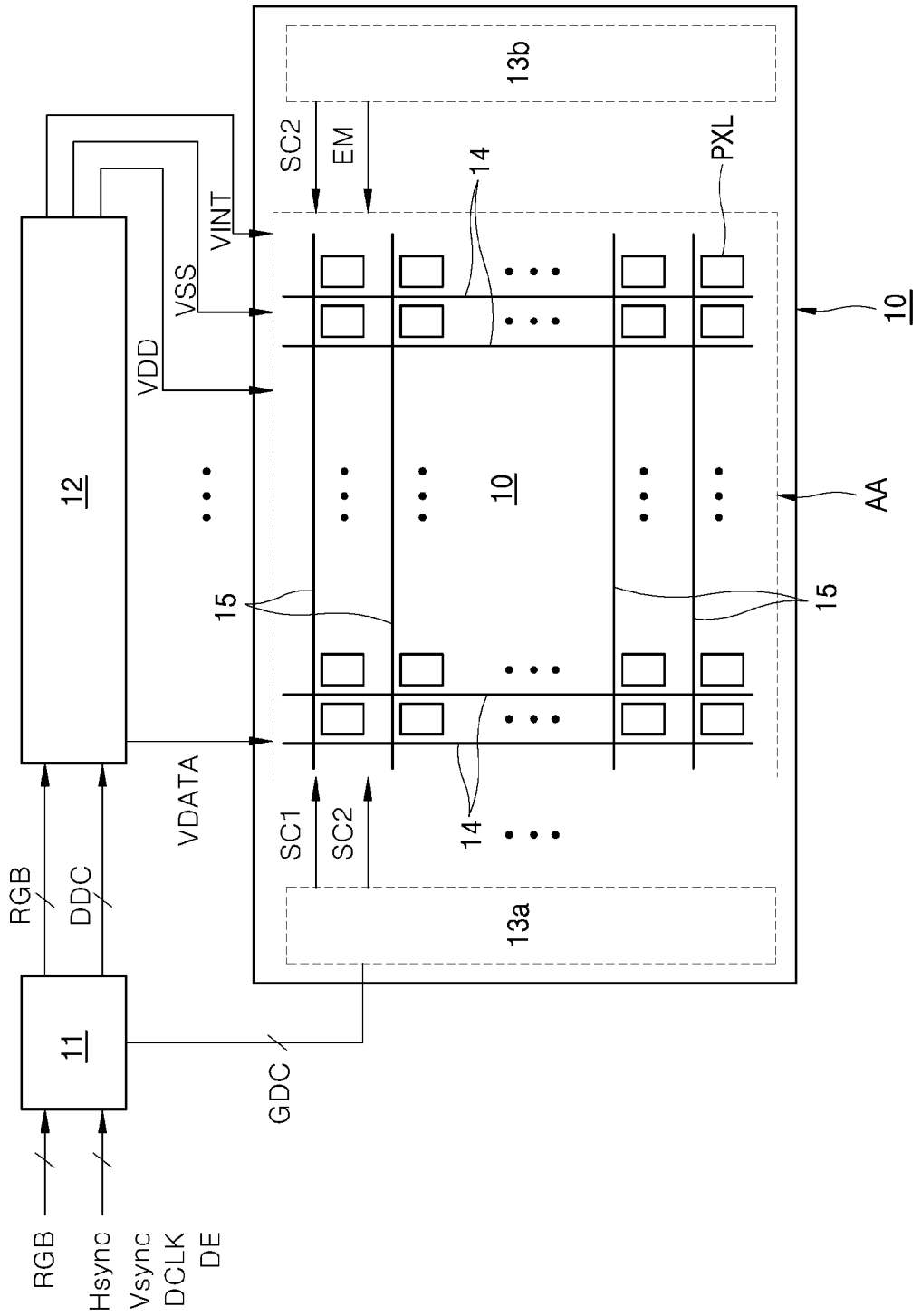
FIG. 1 is a diagram illustrating an organic light emitting display device according to the first aspect of the present disclosure.

FIG. 1 is a diagram illustrating an organic light emitting display device according to the first aspect of the present disclosure. FIG. 2 is a diagram showing first and second gate drive units and a display area of FIG. 1.

As shown in FIG. 1, the organic light emitting display device according to the first aspect of the present disclosure includes a display panel 10 having a display area AA where an image is displayed and a non-display area outside the display area AA, a data drive unit 12 for driving a data line 14 of the display panel 10, gate drive units 13a, 13b which are disposed in the non-display area of the display panel 10 and drives a scan line 15 of the display panel 10, and timing controller 11 for controlling drive timings for the data drive unit 12 and gate drive units 13a, 13b.

The display panel 10 includes a plurality of pixels PXL corresponding to a plurality of pixel areas defined in the display area AA, and first and second gate drive units 13a, 13b disposed in first and second outer areas of the non-display area corresponding to both sides of the display area AA in a horizontal direction.

And, the display panel 10 further includes scan lines 15 which corresponds to respective horizontal lines having pixels, which are disposed successively in the horizontal direction, of the plurality of pixels PXL, and data lines 14 which correspond to respective vertical lines having pixels, which are disposed successively in the vertical direction, of the plurality of pixels PXL, In the meantime, the pixel areas are defined to be disposed in a matrix formation in the display area AA by the intersection between the scan lines 15 and the data lines 14.

The scan lines 15 corresponding to the respective horizontal lines can have plurality of scan lines for supplying a plurality of drive control signals having different pulses.

Although not shown in detail in FIG. 1, the scan lines 15 corresponding to the respective horizontal lines can include a first scan line for supplying a first drive control signal SC1, a second scan line for supplying a second drive control signal SC2, and an emission line for supplying a third drive control signal EM.

And, the display panel 10 further includes a first driving source line for supplying a first driving source VDD, a second driving source line for supplying a second driving source VSS lower than the first driving source VDD, and an initialization source line for supplying an initialization source VINT. Here, the first driving source VDD, the second driving source VSS, and the initialization source VINT can be supplied by the data drive unit 12. And, the initialization source VINT is set to a potential lower than an operation initiation voltage of the organic light emitting device.

The timing controller 11 rearranges the digital video data RGB received from outside according to a resolution of the display panel 10, and supplies the rearranged digital video data RGB' to the data drive unit 12.

And, the timing controller 11 supplies a data control signal DDC for controlling the operation timing of the data drive unit 12 and a gate control signal GDC for controlling the operation timing of the gate drive units 13a, 13b based on various timing signals such as a vertical synchronous signal Vsync, a horizontal synchronous signal Hsync, a dot clock signal DCLK, a data enable signal DE, etc.

The data drive unit 12 converts the rearranged digital video data RGB' to an analog data voltage based on the data control signal DDC. And, the data drive unit 12 supplies a data signal VDATA to the pixels through the data line 14 during the respective horizontal periods based on the rearranged digital video data RGB'.

The first and second gate drive units 13a, 13b supply a plurality of drive control signals SC1, SC2, EM corresponding to the respective horizontal lines based on a gate control signal GDC.

Figure 2:
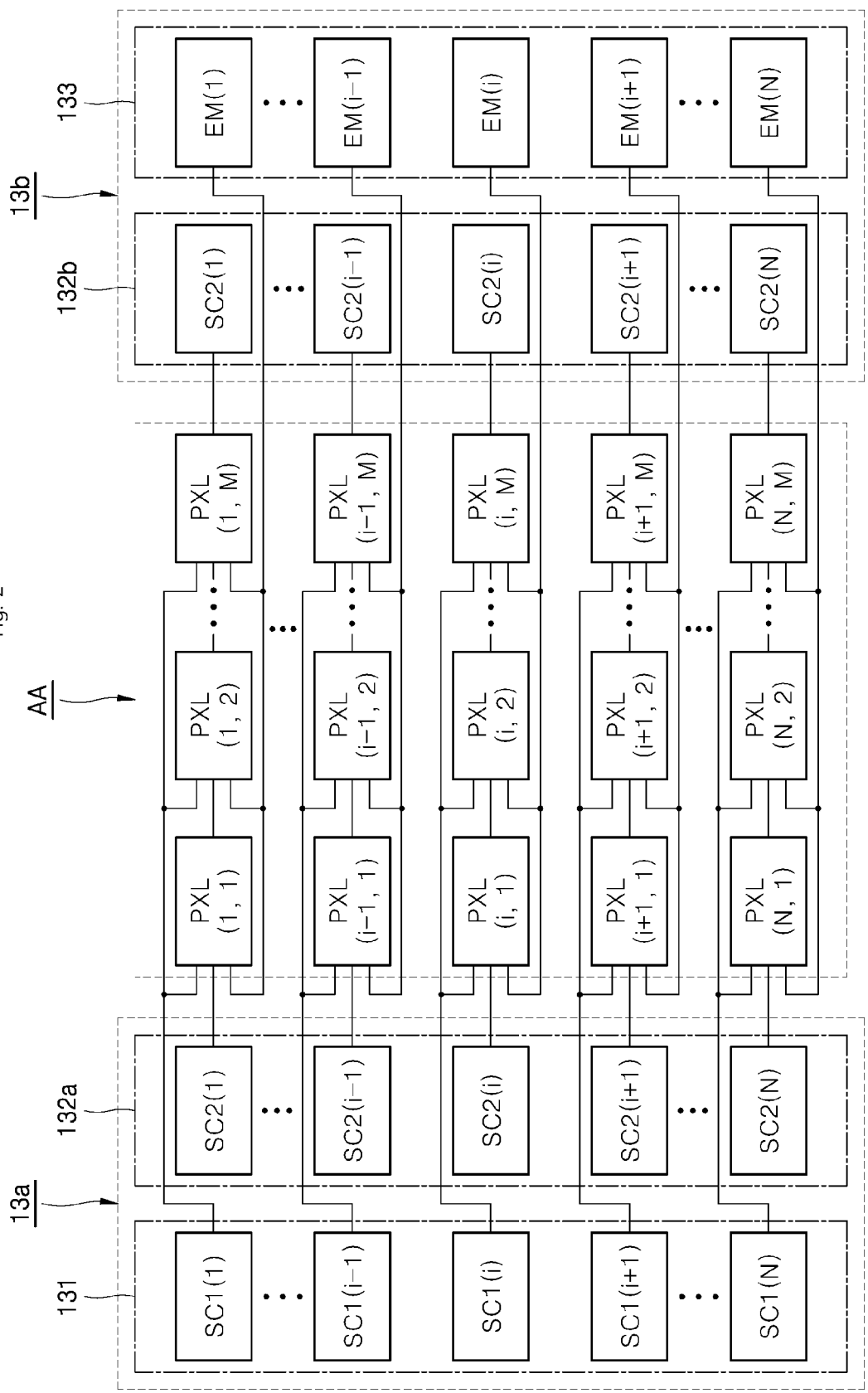
FIG. 2 is a diagram showing first and second gate drive units and a display area of FIG. 1.

As shown in FIG. 2, the first gate drive unit 13a is disposed in a first outer area of the non-display area joining one side of the display area AA (shown on the left side in FIG. 2) in the horizontal direction. The first gate drive unit 13a supplies a first drive control signal SC1 and a second drive control signal SC2 to the respective horizontal lines including pixels of the plurality of pixels PXL which are successively arranged in the horizontal direction.

In order to accomplish this, the first gate drive unit 13a includes a first signal block 131 for supplying the first drive control signal SC1 to the respective horizontal lines and a second signal block 132a for supplying the second drive control signal SC2 having pulses different from those of the first drive control signal SC1 to the respective horizontal lines.

As an example, the plurality of pixels PXL can be disposed in N horizontal lines. In this case, the first gate drive unit 13a, which is disposed at a left side of the respective horizontal lines, includes a first signal block 131 and a second signal block 132b for supplying a first drive control signal SC1($i$) and a second drive control signal SC2($i$) which correspond to an $i^{th}$ horizontal line (PXL(i, 1), PXL(i, 2), . . . PXL(i, M)) (where i is a natural number greater than or equal to 1 and smaller than or equal to N, and N is the number of the horizontal lines).

And, the second gate drive unit 13b is disposed in a second outer area of the non-display area joining the other side of the display area AA (right side in FIG. 1) in the horizontal direction. The second gate drive unit 13b supplies a second drive control signal SC2 and a third drive control signal EM to the respective horizontal lines including pixels of the plurality of pixels PXL which are successively arranged in the horizontal direction. In order to accomplish this, the second gate drive unit 13b includes a second signal block 2 (132b in FIG. 2) for supplying the second drive control signal SC2 to the respective horizontal lines and a third signal block 132a (133 in FIG. 2) for supplying the third drive control signal EM having pulses different from those of the first and second drive control signals SC1, SC2 to the respective horizontal lines.

As an example, the second gate drive unit 13b, which is disposed at a right side of the respective horizontal lines, includes a second signal block 132b and a third signal block 133 for supplying a second drive control signal SC2($i$) and a third drive control signal EM which correspond to an $i^{th}$ horizontal line (PXL(i, 2), PXL(i, 2), . . . PXL(i, M)).

According to the first aspect of the present disclosure, only the second drive control signal SC2 of the first, second, and third drive control signals SC1, SC2, EM having different pulses is supplied to both sides of the respective horizontal lines by the first and second gate drive units 13a, 13b, while the rest first and third drive control signals SC1, EM are supplied from one side of the respective horizontal lines.

In the meantime, the second drive control signal SC2, which is supplied from both sides of the respective horizontal lines by the first and second gate drive units 13a, 13b, is selected to be a signal which affects more on the display quality difference among respective areas than the first and third drive control signals SC1, EM. That is, the second drive control signal SC2 is selected as a signal which incurs the biggest display quality difference among respective areas due to the signal distortion by the line resistance.

For example, the first and second drive control signals SC1, SC2 can be supplied at a turn-on level while the third drive control signal SC3 can be supplied at a turn-off level during the predetermined period. And, when the second drive control signal SC2 is changed to the turn-off level earlier than the first drive control signal SC1 before the predetermined period expires, the display quality difference among respective areas due to a distortion in the second drive control signal SC2 is greater than the display quality difference among respective areas due to a distortion in the first drive control signal SC1.

Therefore, according to the first aspect of the present disclosure, the second drive control signal SC2, which incurs the biggest display quality difference among respective areas due to signal distortions, is supplied from both sides of the respective horizontal lines by the first and second gate drive units 13a, 13b. Therefore, the display quality difference among respective areas due to signal distortions can be minimized.

And, since the first and third drive control signals SC1, EM except for the second drive control signal SC2 are supplied from one side of the respective horizontal lines, the structure of the first and second gate drive units 13a, 13 can be simplified.

By doing so, since the structure of the first and second gate drive units 13a, 13b are simplified compared to the case where the first and second gate drive units 13a, 13b, which are disposed in the non-display area at both sides of the display area AA in the horizontal direction, supply all of the first, second, and third drive control signals, the area of the first and second outer areas in which the first and second gate drive units 13a, 13 are disposed can be decreased. Therefore, the increase in the width of the bezel due to the first and second gate drive units 13a, 13b can be minimized.

In the following, an example of the display panel according to the first aspect of the present disclosure will be explained by referring to FIGS. 3-8.

Figure 3:
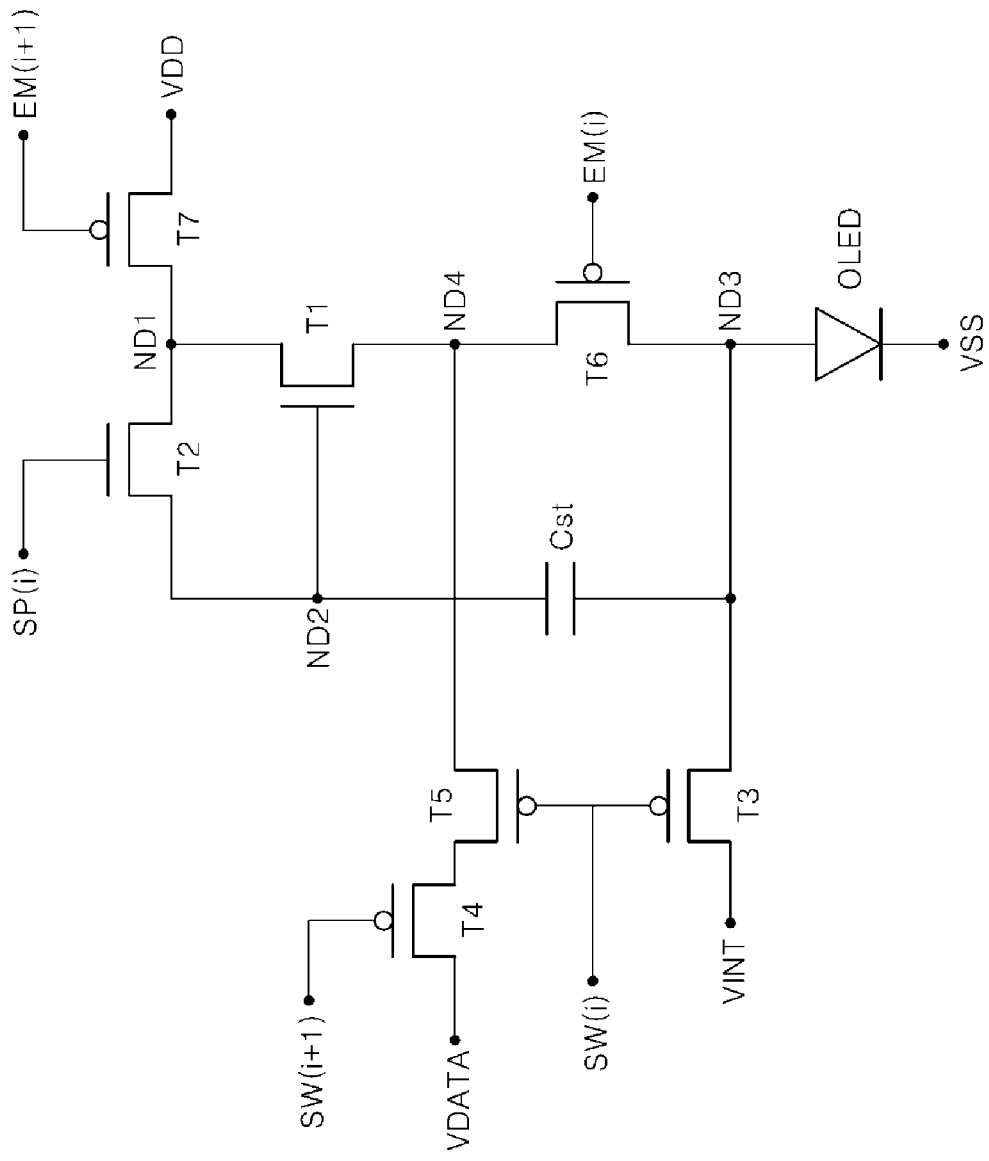
FIG. 3 is a diagram showing an equivalent circuit corresponding to one pixel among the plurality of pixels shown in FIG. 1 which is disposed in an $i^{th}$ horizontal line.
Figure 4:
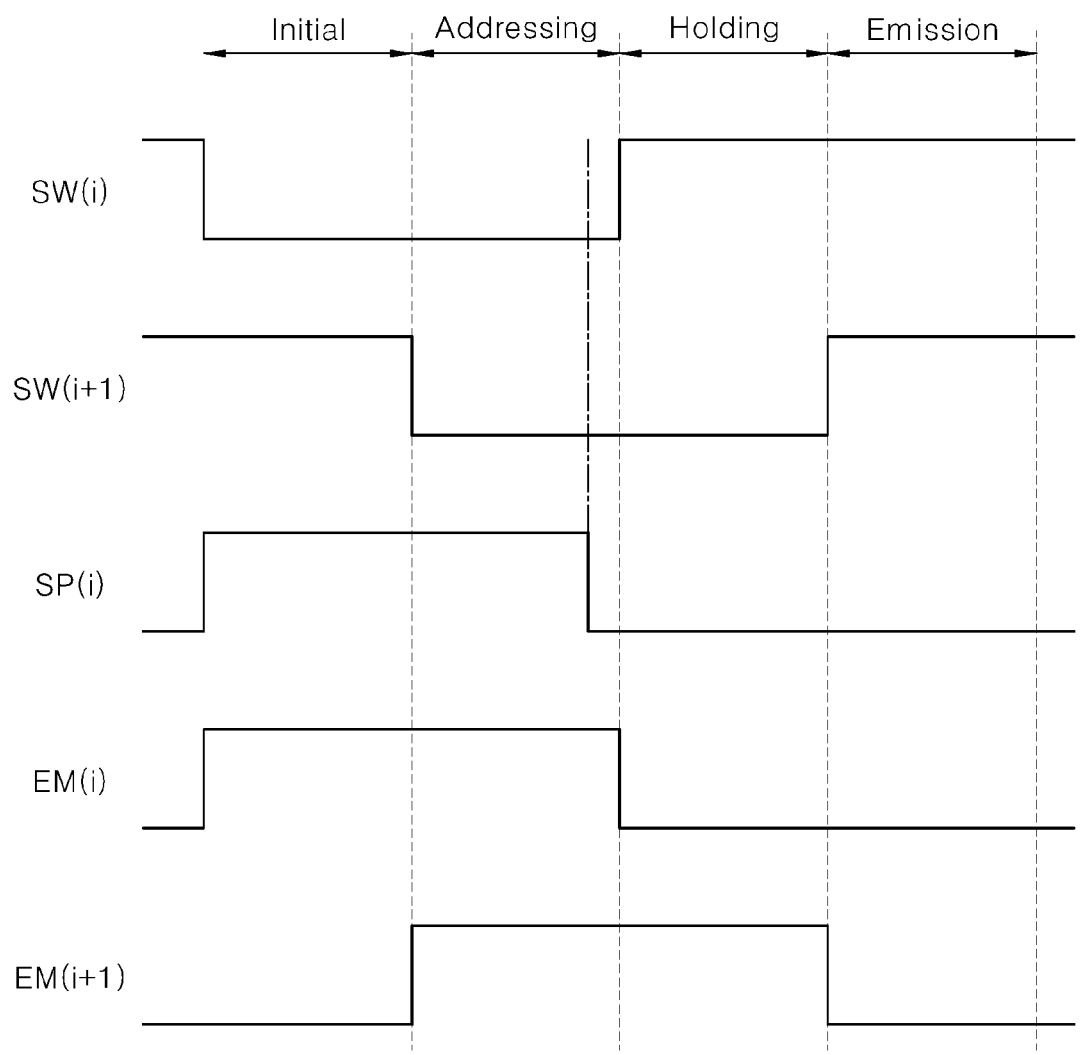
FIG. 4 shows waveforms of the drive control signals of FIG. 3.
Figure 5:
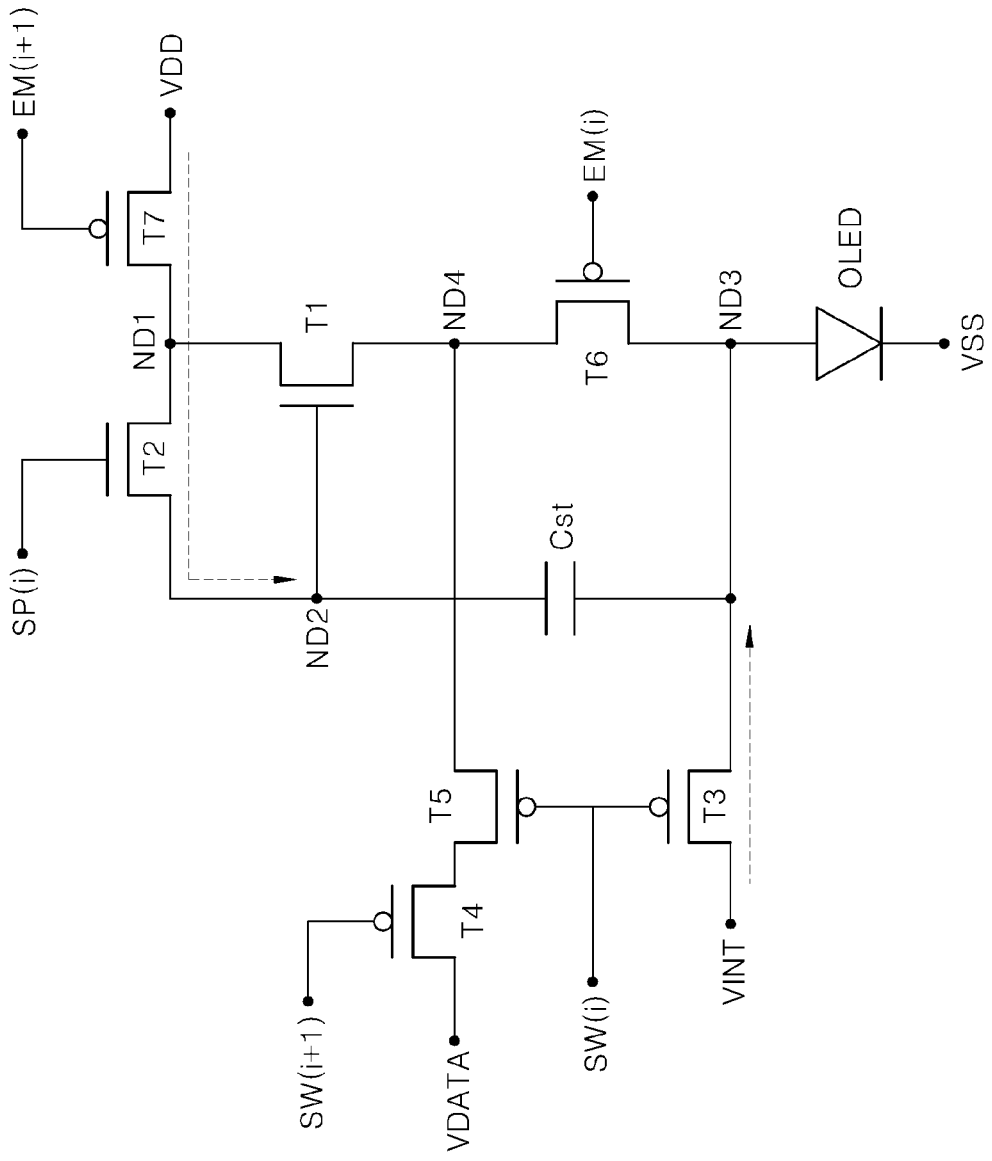
FIG. 5, FIG. 6, and FIG. 7 are diagrams showing current directions in the equivalent circuit corresponding to the pixel during an initial period, an addressing period, and an emission period in FIG. 4.
Figure 6:
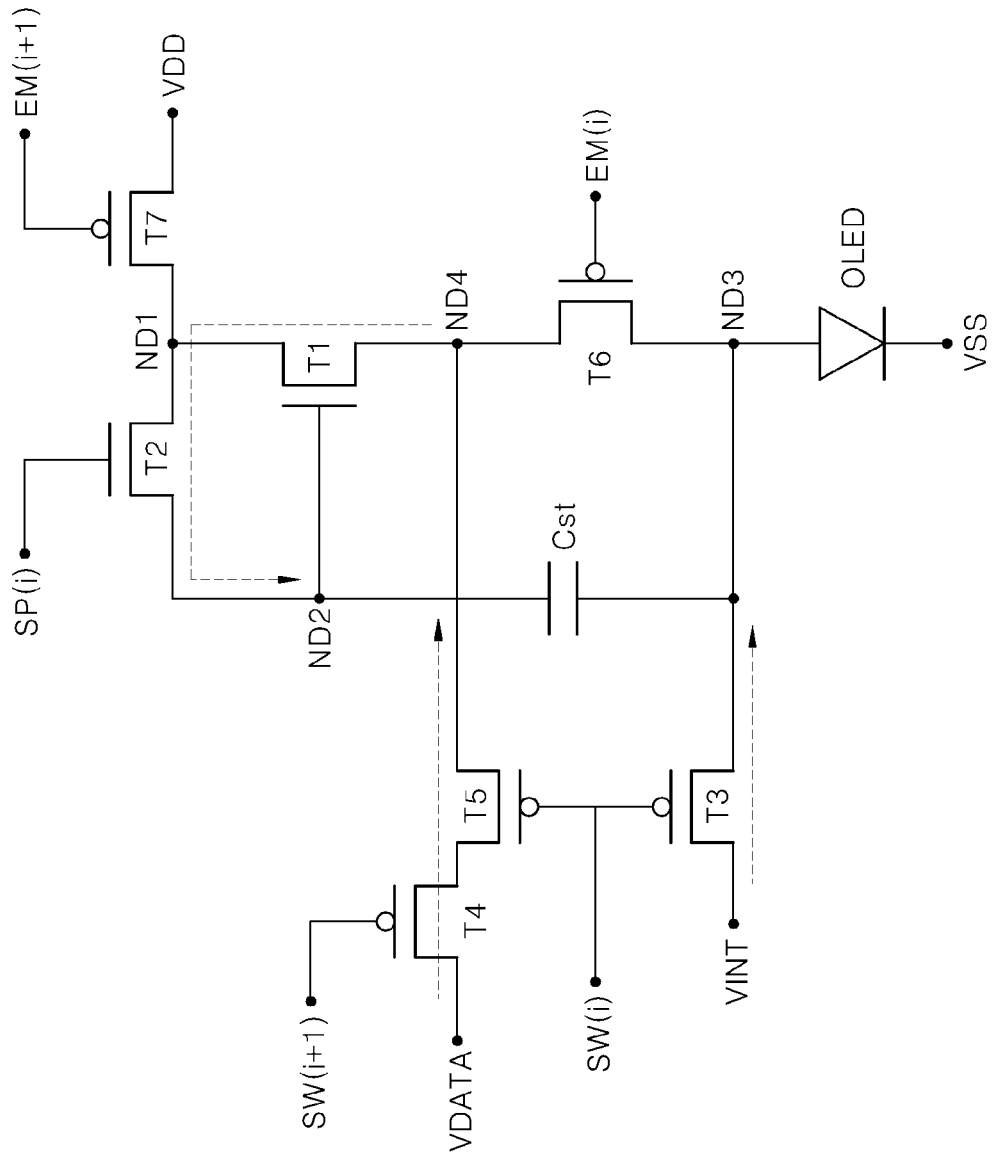
Figure 7:
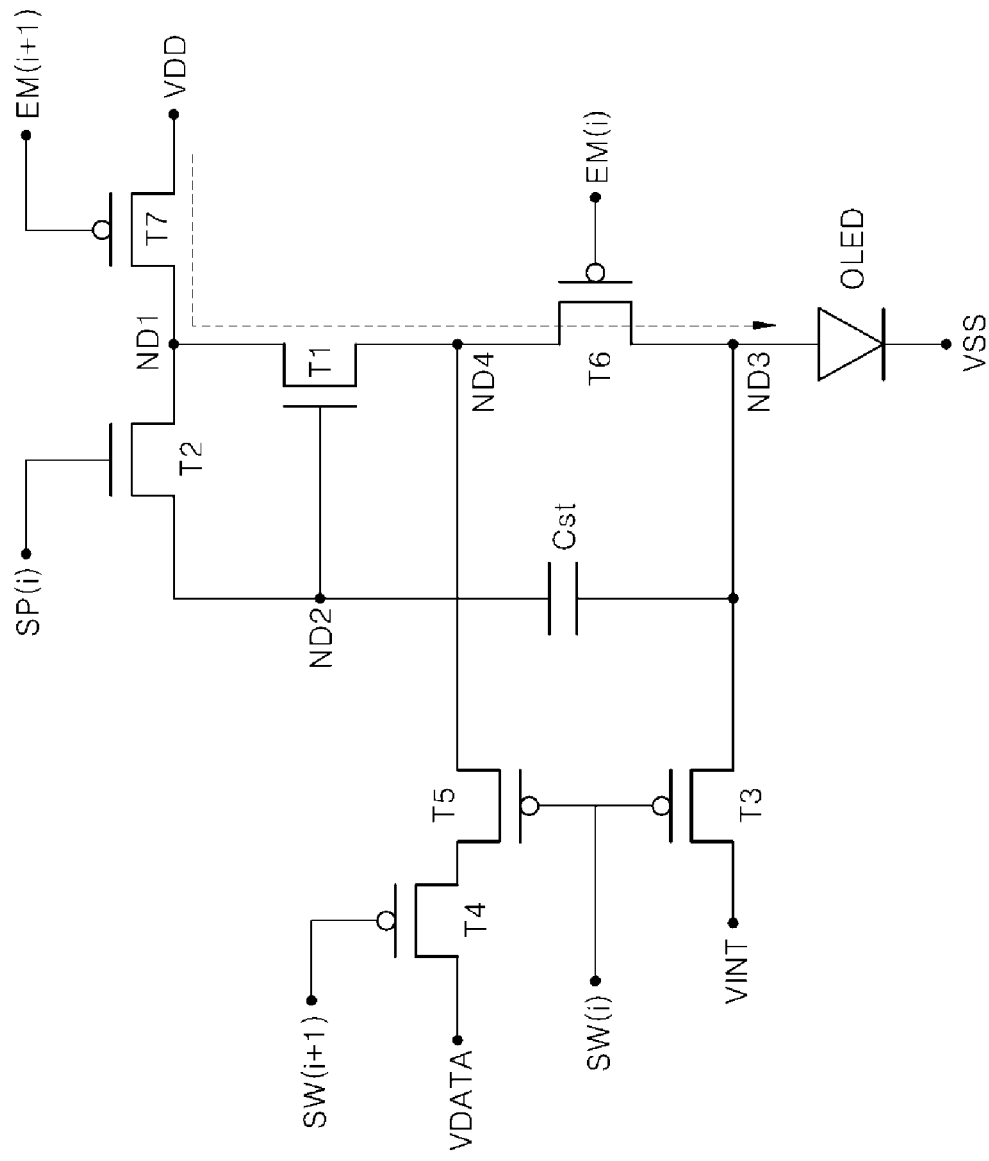
Figure 8:
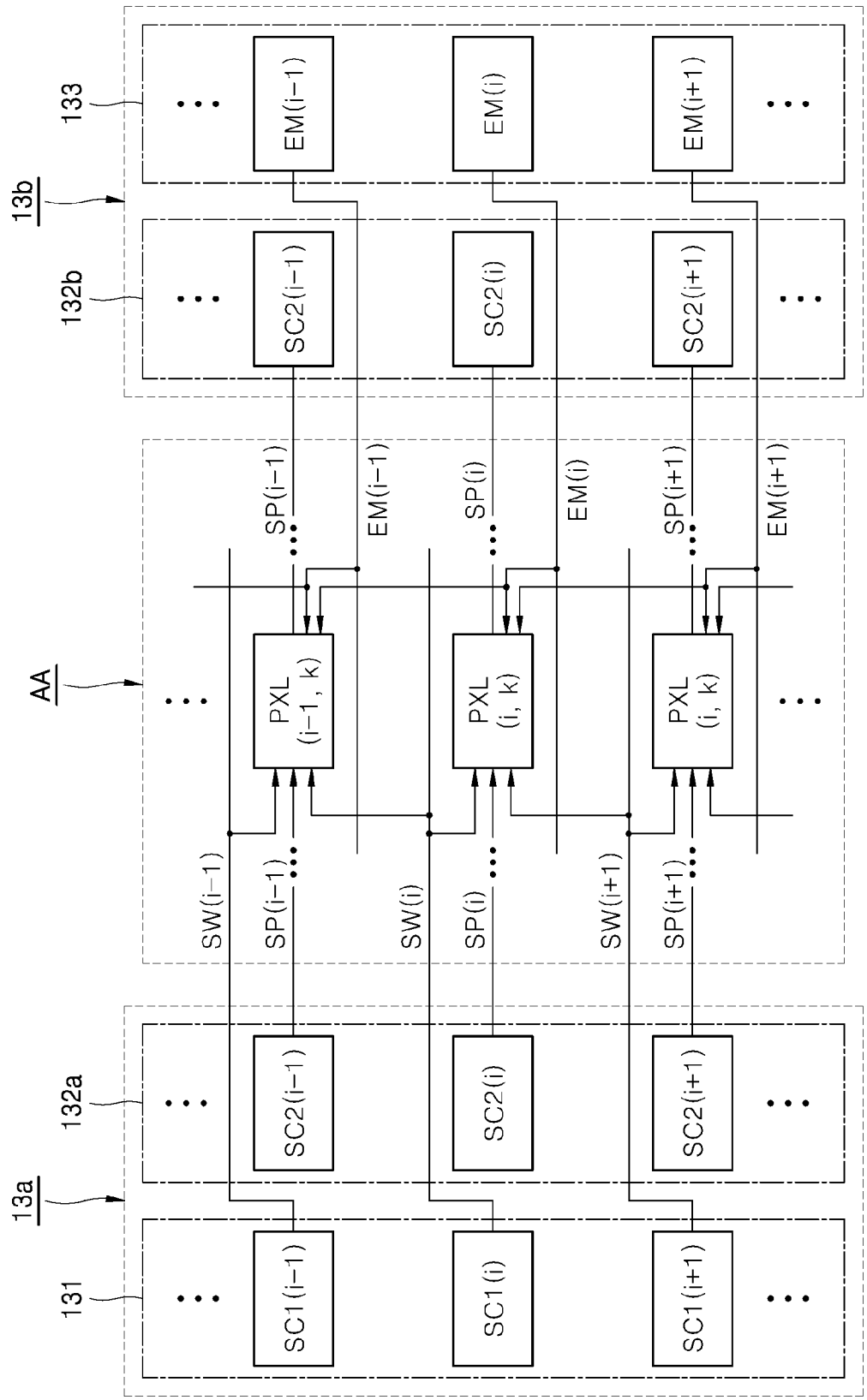
FIG. 8 is a diagram showing first and second gate drive units for supplying drive control signals of FIG. 4.

FIG. 3 is a diagram showing an equivalent circuit corresponding to one pixel among the plurality of pixels shown in FIG. 1 which is disposed in an $i^{th}$ horizontal line. FIG. 4 shows waveforms of the drive control signals of FIG. 3. FIG. 5, FIG. 6, and FIG. 7 are diagrams showing current directions in the equivalent circuit corresponding to the pixel during an initial period, an addressing period, and an emission period in FIG. 4. FIG. 8 is a diagram showing first and second gate drive units for supplying drive control signals of FIG. 4.

As shown in FIG. 3, in the organic light emitting display device according to an aspect of the present disclosure, each of the pixels PXL includes an organic light emitting device OLED, first to seventh thin film transistors T1, T2, T3, T4, T5, T6, T7 and a storage capacitor Cst.

In the respective pixels PXL, the first, fourth, and fifth thin film transistors T1, T4, T5 and the storage capacitor Cst implement a pixel driving circuit for supplying a drive current to the organic light emitting device OLED during the respective image frames, and the rest second, third, sixth, and seventh thin film transistors T2, T3, T6, T7 implement a compensation circuit for compensating for the threshold voltage of the first thin film transistor T1.

And, some of the first, second, third, fourth, fifth, sixth, and seventh thin film transistors T1, T2, T3, T4, T5, T6, and T7 have a structuring including an active layer made of a low-temperature polycrystalline semiconductor (LTPS) material while the rest have a structure including an active layer made of an oxide semiconductor material.

For example, the first thin film transistor T1 is an element for generating the drive current to be supplied to the organic light emitting device OLED. Therefore, the first thin film transistor T1 can be formed in a structure including the active layer made of the oxide semiconductor material whose variation in the threshold voltage due to the brightness of previous image frames is relatively small. By doing so, an afterimage due to the variation in the threshold voltage of the first thin film transistor T1 can be suppressed.

And, the second thin film transistor T2 for compensating for the threshold voltage of the first thin film transistor T1 can have a structure including an active layer made of the oxide semiconductor material which incurs a small leakage current. By doing so, a variation in the brightness due to the leakage current of the second thin film transistor T2 during one image frame can be decreased. Therefore, a flicker phenomenon, in which an image frame shift can be observed when the display device is driven at a low speed, due to the variation in the brightness of respective image frames can be prevented.

In addition, the thin film transistor including the active layer made of the LTPS material and the thin film transistor including the active layer made of the oxide semiconductor material can be made in metal oxide semiconductor (MOS) structures with different conduction types.

In this case, in order to simplify processes, the thin film transistors including active layers made of the LTPS can be implemented as PMOS transistors, while the thin film transistor including the active layer made of the oxide semiconductor material can be implemented as an NMOS transistor.

The organic light emitting device OLED includes an anode electrode and a cathode electrode, as well as an organic light emitting layer (not shown) disposed between the anode and cathode electrodes. For example, the organic light emitting layer includes a hole injection layer, a hole transport layer, a light emitting layer, and an electron transport layer. Alternatively, the organic light emitting display device can further include an electron injection layer.

The first thin film transistor T1 is connected in series with the organic light emitting device OLED between a first driving source line supplying a first driving source VDD and a second driving source line supplying a second driving source VSS which is lower than the first driving source VDD.

A gate electrode of the first thin film transistor T1 is connected with the storage capacitor Cst via a second node ND2. One of the first and second electrodes (source electrode and the drain electrode) is connected with a first node ND1 corresponding to the first driving source VDD, while the other is connected with a fourth node ND4 corresponding to the organic light emitting device OLED.

When the first thin film transistor T1 is turned on based on a turn-on signal supplied from the storage capacitor Cst, the drive current for the organic light emitting device OLED is supplied.

The second thin film transistor T2 is connected between the first node ND1 and the second node ND2. Here, the second node ND2 is connected with the gate electrode of the first thin film transistor T1, while the first node ND1 is connected with one of the first and second electrodes of the first thin film transistor T1 which corresponds to the first driving source VDD. Therefore, the second thin film transistor T2 is provided to compensate for the threshold voltage of the first thin film transistor T1.

In one pixel disposed in the $i^{th}$ horizontal line, the second thin film transistor T2 is turned on based on an $i^{th}$ sampling scan signal SP(i).

The third thin film transistor T3 is connected between an initialization source line supplying an initialization source VINT and the third node ND3.

When the third thin film transistor T3 is turned on based on the $i^{th}$ switching scan signal SW(i), it supplies the initialization source VINT to the third node ND3.

Here, the third thin film transistor T3 is turned on during the same period as the second thin film transistor T2. On the other hand, since the second and third thin film transistors T2, T3 are made in different conduction types, they are turned on by drive control signals of different turn-on levels. Therefore, the $i^{th}$ switching scan signal SW(i) for turning on the second thin film transistor T2 and the $i^{th}$ sampling scan signal SP(i) are separately supplied to the pixels PXL in the respective horizontal lines.

The fourth and fifth thin film transistors T4, T5 are connected in series with each other between a fourth node ND4, between the first thin film transistor T1 and the organic light emitting device OLED, and a data line supplying a data signal VDATA.

More particularly, the fourth thin film transistor T4 is disposed between the data line supplying the data signal VDATA and the fifth thin film transistor T5, while the fifth thin film transistor T5 is disposed between the fourth thin film transistor T4 and the fourth node ND4.

One of the fourth and fifth thin film transistors T4, T5 (fifth thin film transistor T5 in FIG. 3) is turned on based on the $i^{th}$ switching scan signal SW(i), while the other (fourth thin film transistor T4 in FIG. 3) is turned on based on an $i+1^{th}$ switching scan signal SW(i+1).

For example, the fifth thin film transistor T5 is turned on based on the $i^{th}$ switching scan signal SW(i) corresponding to the $i^{th}$ horizontal line, while the fourth thin film transistor T4 is turned on based on the $i+1^{th}$ switching scan signal SW(i+1) corresponding to an $i+1^{th}$ horizontal line which follows the $i^{th}$ horizontal line. When all of the fourth and fifth thin film transistors T4, T5 are turned on, the data signal VDATA is supplied to the fourth node ND4.

The storage capacitor Cst is disposed between the second node ND2, which is connected with the gate electrode of the first thin film transistor T1, and the third node ND3 which is connected with the anode electrode of the organic light emitting device OLED.

The sixth thin film transistor T6 is connected between the fourth node ND4 and the third node ND3. When the sixth thin film transistor T6 is turned on based on an $i^{th}$ emission signal EM(i) corresponding to the $i^{th}$ horizontal line, it generates a current path where the drive current is supplied to the organic light emitting device OLED by the first thin film transistor T1.

The seventh thin film transistor T7 is connected between the first driving source line supplying the first driving source VDD and the first node ND1. When the seventh thin film transistor T7 is turned on based on the $(i+1)^{th}$ emission signal EM(i+1) corresponding to the $(i+1)^{th}$ horizontal line, it supplies the first driving source VDD to the first node ND1.

As shown in FIG. 4, the $i^{th}$ switching scan signal SW(i), the $i^{th}$ sampling scan signal SP(i), and the $i+1^{th}$ emission signal EM(i+1) can be supplied at respective turn-on levels during an initial period Initial of the respective image frames. For example, the turn-on levels of the switching scan signal SW and the emission signal EM can be a low level corresponding to a PMOS transistor, while the turn-on level of the sampling scan signal SP can be a high level corresponding to an NMOS transistor.

Therefore, as shown in FIG. 5, the third and fifth thin film transistors T3, T5 are turned on based on the $i^{th}$ switching scan signal SW(i) during the initial period Initial. By doing so, the initialization source VINT is supplied to the third node ND3 through the third thin film transistor T3 which is turned on.

And, the second thin film transistor T2 is turned on by the $i^{th}$ sampling scan signal SP(i), and the seventh thin film transistor T7 is turned on by the $i+1^{th}$ emission signal EM(i+1). Therefore, a differential voltage (VDD-Vth) between the first driving source VDD and the threshold voltage (Vth) of the first thin film transistor T1 is supplied to the second node ND2 through the turned-on second and seventh thin film transistors T2, T7.

And, since the second thin film transistor T2 is turned on, a potential of the gate electrode of the first thin film transistor T1 comes to be close to the threshold voltage (Vth), which causes the first thin film transistor T1 to be turned on.

Then, as shown in FIG. 3, the $i^{th}$ switching scan signal SW(i) and the $i^{th}$ sampling scan signal SP(i) maintain respective turn-on levels while the $i^{th}$ emission signal EM(i) maintains the turn-off level during the addressing period Addressing of the respective image frames. On the other hand, the $(i+1)^{th}$ emission signal EM(i+1) is supplied at the turn-off level while the $(i+1)^{th}$ switching scan signal SW(i+1) is supplied at the turn-on level.

Therefore, as shown in FIG. 6, since the third thin film transistor T3 maintains the turn-on state by the $i^{th}$ switching scan signal SW(i), which maintains the turn-on level during the addressing period Addressing, the supply of the initialization source VINT to the third node ND3 is maintained.

and, the second thin film transistor T2 maintains the turn-on state by the $i^{th}$ sampling scan signal SP(i) which maintains the turn-on level. On the other hand, the seventh thin film transistor T7 is turned off by the $(i+1)^{th}$ emission signal EM(i+1) at the turn-off level.

Also, the fourth thin film transistor T4 is turned on by the $i+1^{th}$ switching scan signal SW(i+1), and the third and fifth thin film transistors T3, T5 maintain the turn-on state by the $i^{th}$ switching scan signal SW(i) which maintains the turn-on level.

In this manner, the data signal VDATA is supplied to the fourth node ND4 via the fourth and fifth thin film transistors which are turned on.

And, since the second thin film transistor T2 is turned on, the first thin film transistor T1 is also turned on. Therefore, a differential voltage (VDATA−Vth) between the data signal VDATA and the threshold voltage (Vth) of the first thin film transistor T1 is supplied to the second node ND2 via a current path including the first and second thin film transistors T1, T2.

Therefore, the potential of the second node ND2 is decreased from the voltage VDD-Vth during the initial period Initial by the voltage (VDATA−Vth) which is supplied during the addressing period Addressing.

And, the storage capacitor Cst is charged by the differential voltage (VDD−VDATA) between the second node ND2 and the third node ND3.

As shown in FIG. 4, a holding period Holding is provided during which the $i+1^{th}$ emission signal EM(i+1) and the $(i+1)^{th}$ switching scan signal SW(i+1), which are changed during the addressing period Addressing, maintain their respective levels.

That is, during the holding period Holding, the $i+1^{th}$ emission signal EM(i+1) maintains the turn-off level from the addressing period Addressing, while the $i+1^{th}$ switching scan signal SW(i+1) maintains the turn-on level from the addressing period Addressing.

On the other hand, during the holding period Holding, the $i^{th}$ switching scan signal SW(i) and the $i^{th}$ sampling scan signal SP(i) are changed to the respective turn-off levels and the $i^{th}$ emission signal EM(i) is changed to the turn-on level.

Thanks to the holding period Holding as explained in the above, the $i+1^{th}$ emission signal EM(i+1) can have the same pulse-width as the $i^{th}$ emission signal EM(i) and the $i+1^{th}$ switching scan signal SW(i+1) can have the same pulse-width as the $i^{th}$ switching scan signal SW(i). Therefore, the structure of the gate drive units 13a, 13b can be simplified since no separate signal block for supplying drive control signals corresponding to the fourth thin film transistor T4 and the seventh thin film transistors T7 is required.

Then, as shown in FIG. 3, the $i^{th}$ switching scan signal SW(i) and the $i^{th}$ sampling scan signal SP(i) maintain respective turn-off levels while the $i^{th}$ emission signal EM(i) maintains the turn-on level during the emission period Emission of the respective image frames. And, the $i+1^{th}$ switching scan signal SW(i+1) is supplied at the turn-off level while the $i+1^{th}$ emission signal EM(i+1) is supplied at the turn-on level.

In the meantime, as shown in FIG. 7, the seventh thin film transistor T7 is turned on by the $i+1^{th}$ emission signal EM(i+1) at the turn-on level, and the sixth thin film transistor T6 is turned on by the $i^{th}$ emission signal EM(i) which maintains the turn-on level. Therefore, the drive current is supplied to the organic light emitting device OLED via the current path including the sixth thin film transistor T6, the first thin film transistor T1, and the seventh thin film transistors T7. In the meantime, the amount of the drive current corresponds to the data signal VDATA.

As explained in the above, according to the first aspect of the present disclosure, in the respective pixels PXL, the series-connected fourth and fifth thin film transistors T4, T5 are disposed between the data line for supplying the data signal VDATA and the first thin film transistor T1.

And, according to an aspect of the present disclosure, the respective image frames can further include a holding period Holding between the addressing period Addressing and the emission period Emission.

The drive control signal corresponding to one of the fourth and fifth thin film transistors T4, T5 (fifth thin film transistor T5) can be selected as the $i^{th}$ switching scan signal SW(i) which is supplied at the turn-on level during the initial period Initial and the addressing period Addressing, in the same manner for the case of the third thin film transistor T3 for supplying the initialization source VINT.

And, the drive control signal corresponding to the other of the fourth and fifth thin film transistors T4, T5 (fourth thin film transistor T4) can be selected as the $i+1^{th}$ switching scan signal SW(i+1) which is supplied at the turn-on level during the addressing period Addressing and has the same pulse-width as the $i^{th}$ switching scan signal SW(i).

As a result, the structure of the gate drive units 13a, 13b can be simplified because no separate signal block is required for supplying the drive control signal for turning on the fourth and fifth thin film transistors T4, T5 during the addressing period Addressing.

And, the drive control signal corresponding to the sixth thin film transistor T6 can be selected as the $i+1^{th}$ emission signal EM(i+1) which is supplied at the turn-off level during the addressing period Addressing and has the same pulse-width as the $i^{th}$ emission signal EM(i).

As a result, the structure of the gate drive units 13a, 13b can be simplified because no separate signal block is required for supplying the drive control signal for turning off the sixth thin film transistors T6 during the addressing period Addressing.

Therefore, according to the first aspect of the present disclosure, the structure of the gate drive unit can be further simplified because the drive control signals supplied to the respective pixels PXL can be supplied by three signal blocks corresponding to the respective horizontal lines.

Meanwhile, as shown in FIG. 4, according to the first aspect, the $i^{th}$ switching scan signal SW(i) and the $i^{th}$ sampling scan signal SP(i) are supplied at respective turn-on levels during the addressing period Addressing. And, as shown by the dashed-dot line in FIG. 4, the $i^{th}$ sampling scan signal SP(i) of the $i^{th}$ switching scan signal SW(i) and the $i^{th}$ sampling scan signal SP(i) is changed to the turn-off level earlier than the $i^{th}$ switching scan signal SW(i) before the addressing period Addressing expires. Therefore, since the signal distortion in the sampling scan signal SP causes more display quality difference among respective areas than the signal distortion in the switching scan signal SW, not the switching scan signal SW but the sampling scan signal SP needs to be supplied from both sides of the respective horizontal lines.

As a result, as shown in FIG. 8, according to the first aspect, the sampling scan signal SP can be supplied by the second signal blocks 132a, 132b, which are provided in both the first and second gate drive units 13a, 13b, the switching scan signal SW can be supplied by the first signal block 131 provided in the first gate drive unit 13a, and the emission signal EM can be supplied by the third signal block 133 provided in the second gate drive unit 13b.

As explained in the above, according to the first aspect of the present disclosure, one drive control signal of the drive control signal supplied to the respective horizontal lines which generates the biggest brightness difference among respective areas is supplied from both sides of the respective horizontal lines, while the rest drive control signals are supplied from one side of the respective horizontal lines.

By doing so, the structure of the first and second gate drive units 13a, 13b, which are disposed in the first and second outer areas of the non-display area corresponding to both sides of the display area AA, can be simplified, which results in a decrease in the areas of the gate drive units 13a, 13b and a reduction in the width of the bezel of the display device.

Also, since one drive control signal of the drive control signals supplied to the respective horizontal lines which generates the biggest brightness difference among respective areas is supplied from both sides of the respective horizontal lines, a decrease in brightness difference among respective areas due to the simplified structure of the gate drive units 13a, 13b can be minimized.

By the way, in contrast to the first aspect of the present disclosure, the $i^{th}$ switching scan signal SW(i) of the $i^{th}$ switching scan signal SW(i) and the $i^{th}$ sampling scan signal SP(i) is changed to the turn-off level earlier than the $i^{th}$ sampling scan signal SP(i) before the addressing period Addressing expires.

Figure 9:
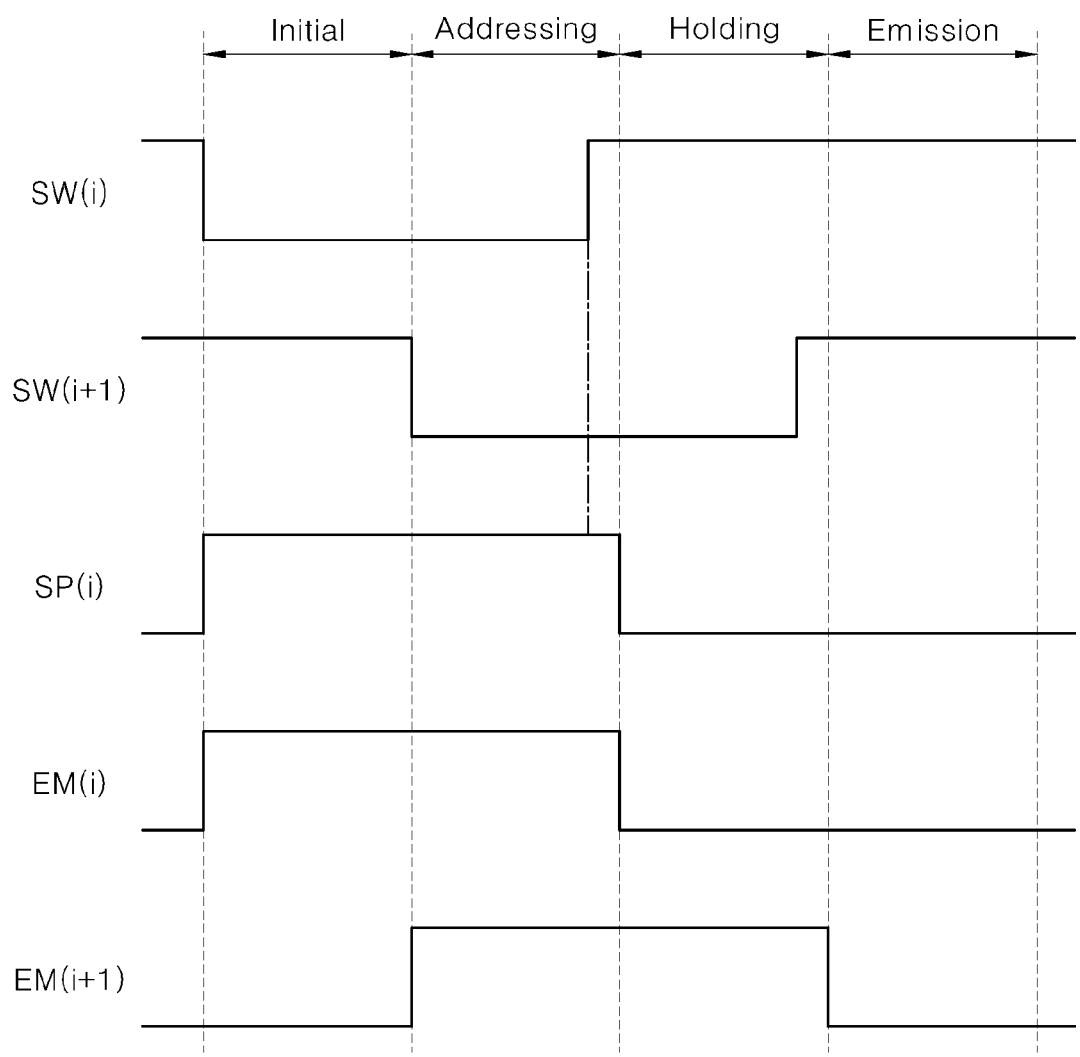
FIG. 9 is a diagram showing waveforms of drive control signals of FIG. 3 according to the second aspect of the present disclosure.
Figure 10:
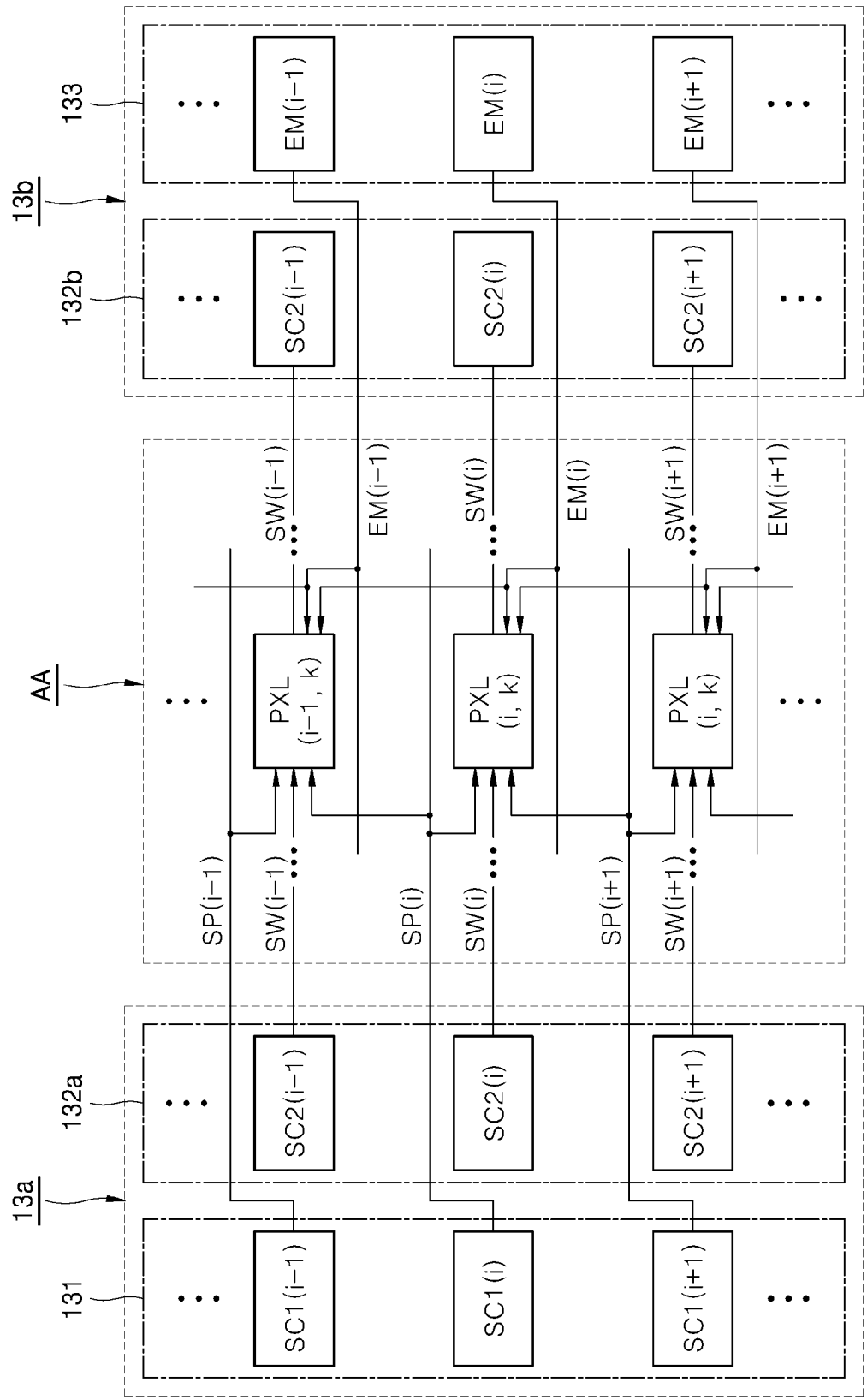
FIG. 10 is a diagram showing first and second gate drive units for supplying drive control signals of FIG. 9.

FIG. 9 is a diagram showing waveforms of drive control signals of FIG. 3 according to the second aspect of the present disclosure. FIG. 10 is a diagram showing first and second gate drive units for supplying drive control signals of FIG. 9.

As shown in FIG. 9, according to the second aspect of the present disclosure, the $i^{th}$ sampling scan signal SP(i) of the $i^{th}$ switching scan signal SW(i) and the $i^{th}$ sampling scan signal SP(i) is changed to the turn-on level earlier than the $i^{th}$ switching scan signal SW(i) before the addressing period Addressing expires.

In this case, it is expected that the signal distortion in the switching scan signal SW can cause bigger display quality difference among respective areas than the signal distortion in the sampling scan signal SP. Therefore, according to the second aspect, the switching scan signal SW is supplied from both sides of the respective horizontal lines while the sampling scan signal SP is supplied from one side of the respective horizontal lines.

As a result, as shown in FIG. 10, according to the second aspect, the switching scan signal SW can be supplied by the second signal blocks 132a, 132b, which are provided in both the first and second gate drive units 13a, 13b, the sampling scan signal SP can be supplied by the first signal block 131 provided in the first gate drive unit 13a, and the emission signal EM can be supplied by the third signal block 133 provided in the second gate drive unit 13b.

As explained in the above, the second aspect is the same as the first aspect except that the signals which are supplied from the first and second signal blocks 131, 132a, and 132b are different. Therefore, duplicate explanation will be omitted in the following.

Meanwhile, according to aspects of the present disclosure, the respective signal blocks provided in the first and second gate drive units 13a, 13b include buffer units for outputting the drive control signals to the respective horizontal lines.

Figure 11:
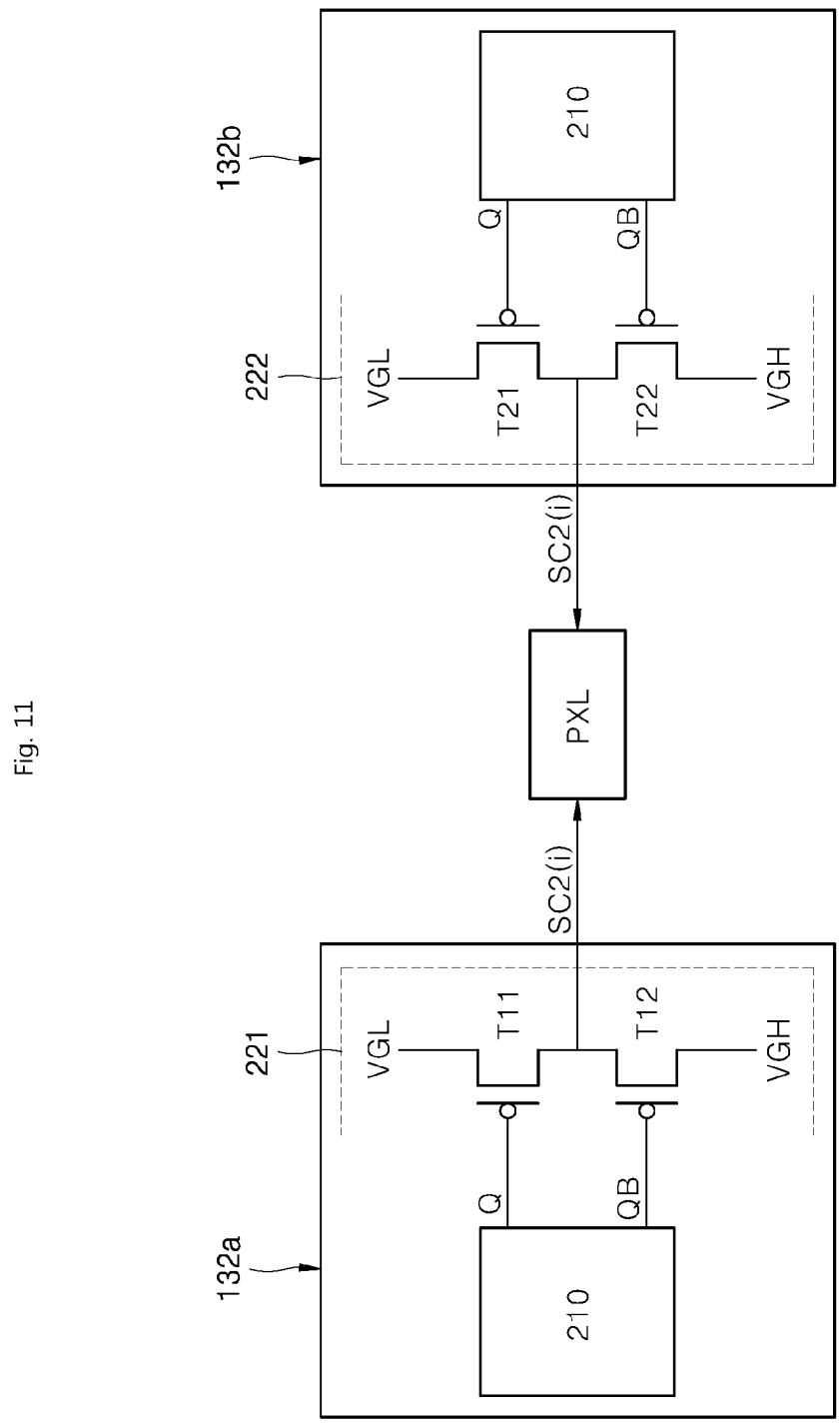
FIG. 11 is a diagram showing one example of the second signal block of the first and second gate drive units shown in FIG. 8 and FIG. 10.

FIG. 11 is a diagram showing one example of the second signal block of the first and second gate drive units shown in FIG. 8 and FIG. 10.

As shown in FIG. 11, each of the second signal blocks 132a, 132b of the first and second gate drive units 13a and 13b includes a register unit 210 for sequentially selecting the N horizontal lines, and buffer units which are connected with the scan lines of the respective horizontal lines.

The buffer unit 221 which is disposed in the first gate drive unit 13a includes first and second buffer transistors T11, T12 which are connected in series between a first gate driving source VGH and a second gate driving source VGL lower than the first gate driving source VGH.

Similarly, the buffer unit 222 which is disposed in the second gate drive unit 13b also includes first and second buffer transistors T21, T22 which are connected in series between the first gate driving source VGH and the second gate driving source VGL.

By the say, the signal block for supplying the emission signal EM is normally formed in a structure which is simpler than that of the signal block for supplying the switching scan signal SW and the sampling scan signal SP.

Therefore, according to the third aspect, the signal block supplying the emission signal of the signal blocks disposed only in one of the first and second gate drive units 13a, 13b can be disposed in the smaller area than the other signal blocks.

Figure 12:
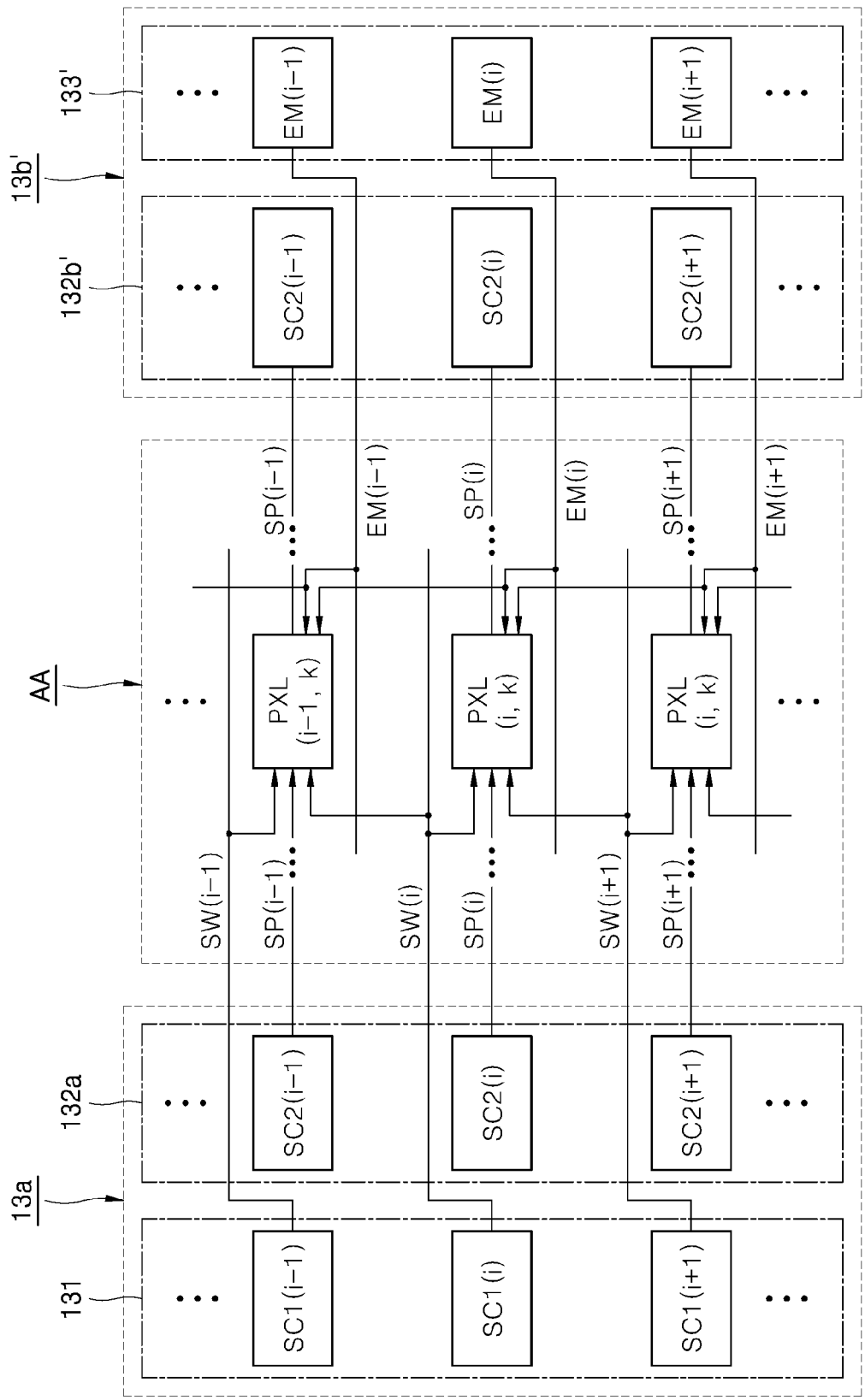
FIG. 12 is a diagram showing first and second gate drive units according to the third aspect of the present disclosure.
Figure 13:
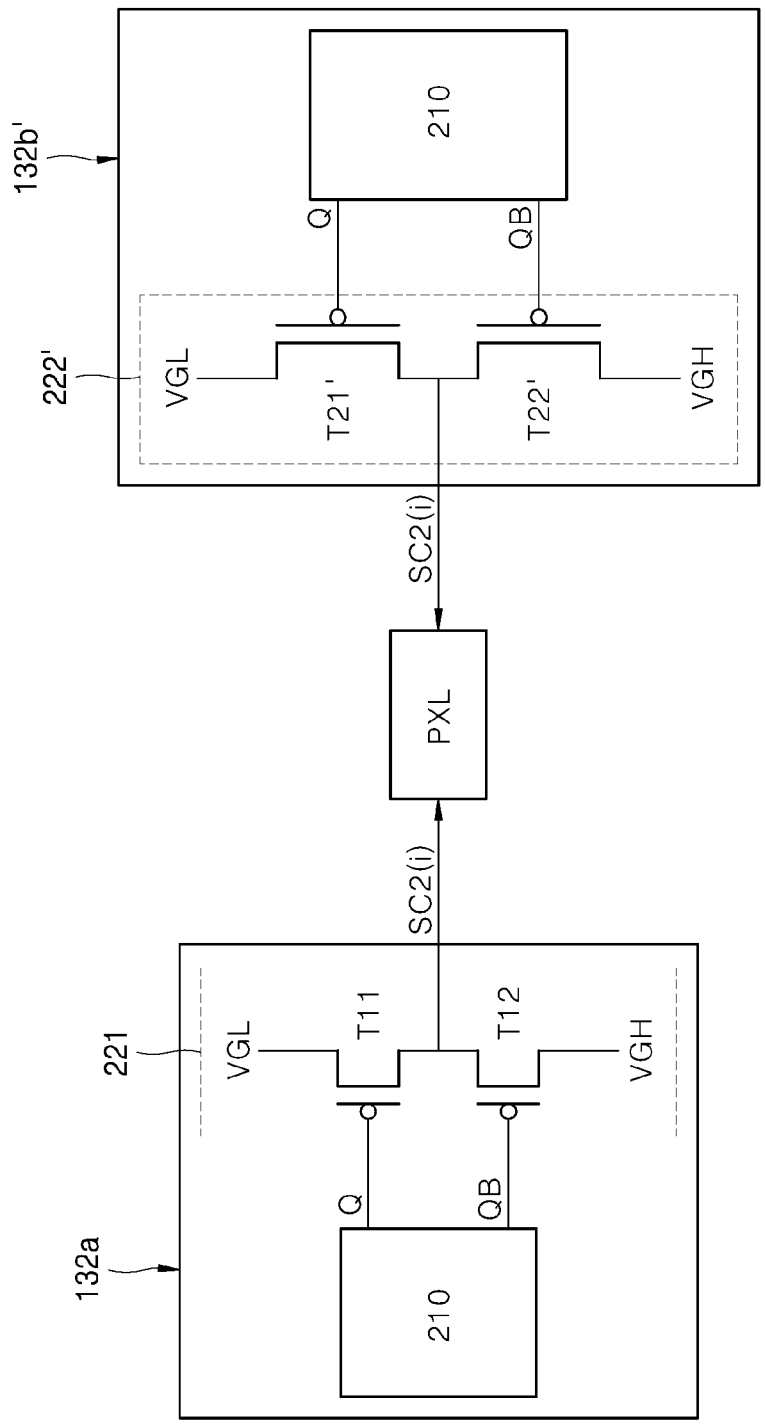
FIG. 13 is a diagram showing one example of the second signal block of the first and second gate drive units shown in FIG. 12.

FIG. 12 is a diagram showing first and second gate drive units according to the third aspect of the present disclosure. FIG. 13 is a diagram showing one example of the second signal block of the first and second gate drive units shown in FIG. 12.

As shown in FIG. 12, according to the third aspect of the present disclosure, the third signal block 133 which is disposed in the second gate drive unit 13b and supplies the emission signal EM is disposed in the smaller area than the first signal block 131 which is disposed only in the first gate drive unit 13a.

And, since the area for the third signal block 133 is decreased, the second signal block of 132b of the second gate drive unit 13b is disposed in the larger area than the second signal block 132a of the first gate drive unit 13a.

Therefore, as shown in FIG. 13, the buffer unit 222' of the second signal block 132b' of the second gate drive unit 13b can be disposed in the larger area than the buffer unit 221 of the second signal block 132a of the first gate drive unit 13a.

That is, the first and second buffer transistors T21', T22' which are disposed in the buffer unit 222' of the second signal block 132b' of the second gate drive unit 13b can have wider channel widths than the first and second buffer transistors T11, T12 which are disposed in the buffer unit 221 of the second signal block 132a of the first gate drive unit 13a. Here, the channel width can correspond to a separation distance between the source electrode and the drain electrode of the transistor.

By doing so, the brightness difference among respective areas due to the distortion in the drive control signal supplied from only side of the respective horizontal lines can be compensated for.

That is, since the first signal block 131 is disposed in the first gate drive unit 13a, the first drive control signal SC1 from the first signal block 131 can be distorted in an area adjacent to the second gate drive unit 13b, which can result in the brightness difference among respective areas.

On the other hand, according to the third aspect, since the buffer unit 222' of the second signal block 132b' of the second gate drive unit 13b includes the buffer transistor having a wider channel width that that of the buffer unit 221 of the second signal block 132*a* of the first gate drive unit 13*a*, the second drive control signal SC2 from the second gate drive unit 13*b* can be outputted at a higher magnitude than the first drive control signal SC1 from the first gate drive unit 13*a*.

Thanks to the magnitude difference between the second drive control signals from the first and second gate drive units 13*a*, 13*b*, the brightness difference among respective areas due to the first drive control signal SC1 can be compensated for.

As explained in the above, the third aspect is the same as the first and second aspects except than the buffer unit 221, 222' provided in the second signal blocks 132*a*, 132*b'* of the first and second gate drive units 13*a*, 13*b* have buffer transistors with different channel widths. Therefore, duplicate explanation will be omitted in the following.

Meanwhile, the switching scan signal SW and the sampling scan signal SP corresponding to the respective horizontal lines correspond to transistors with different conduction types, and they are supplied at respective turn-on levels during the initial period Initial and the addressing period Addressing. That is, the switching scan signal SW and the sampling scan signal SP are always inverted with respect to each other.

As a result, the second signal blocks 132*a*, 132*b* of the first and second gate drive units 13*a*, 13*b* can generate the drive control signal by inverting the output signal of the first signal block 131 of the first gate drive unit 13*a*.

Figure 14:
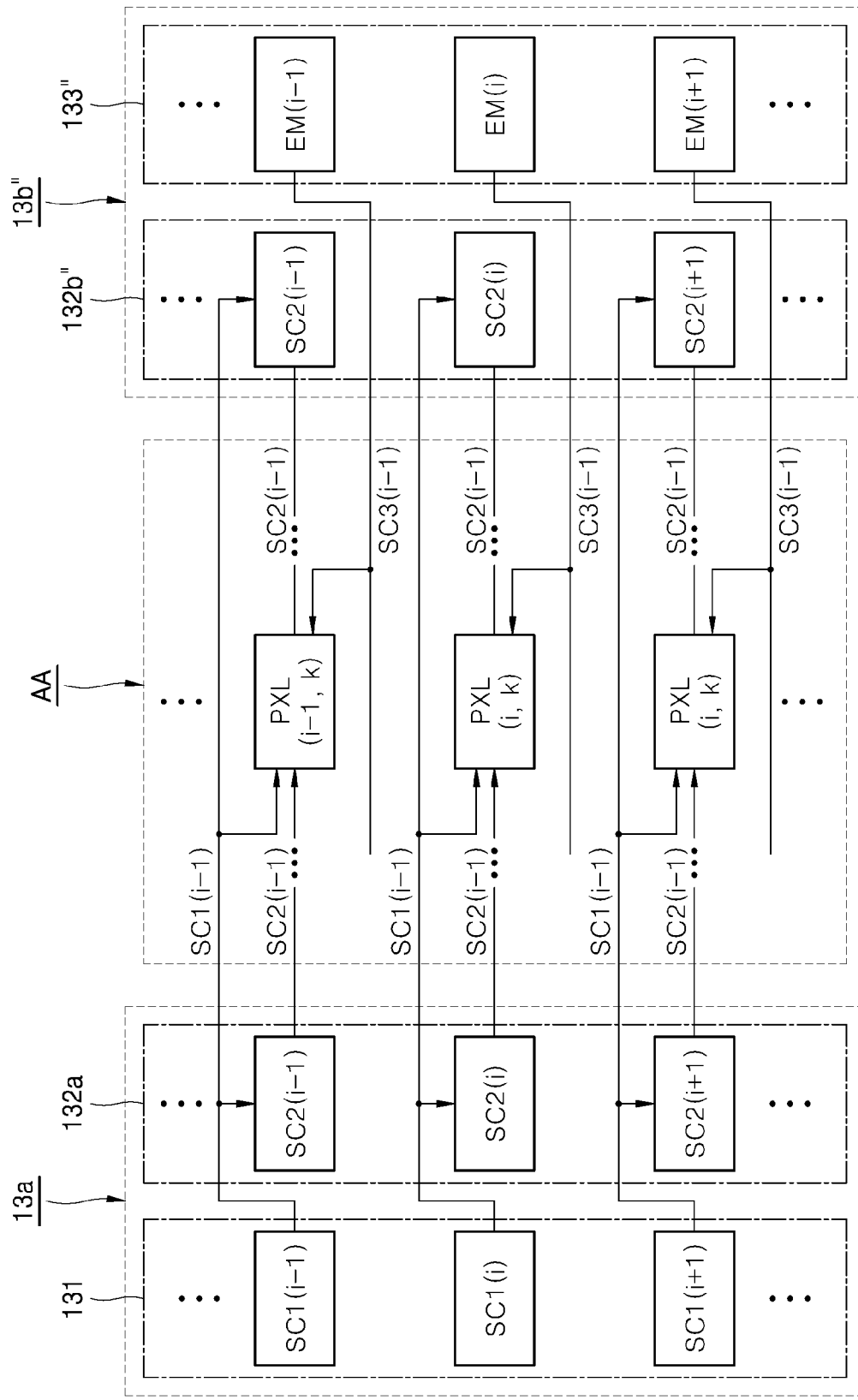
FIG. 14 is a diagram showing first and second gate drive units according to the fourth aspect of the present disclosure.
Figure 15:
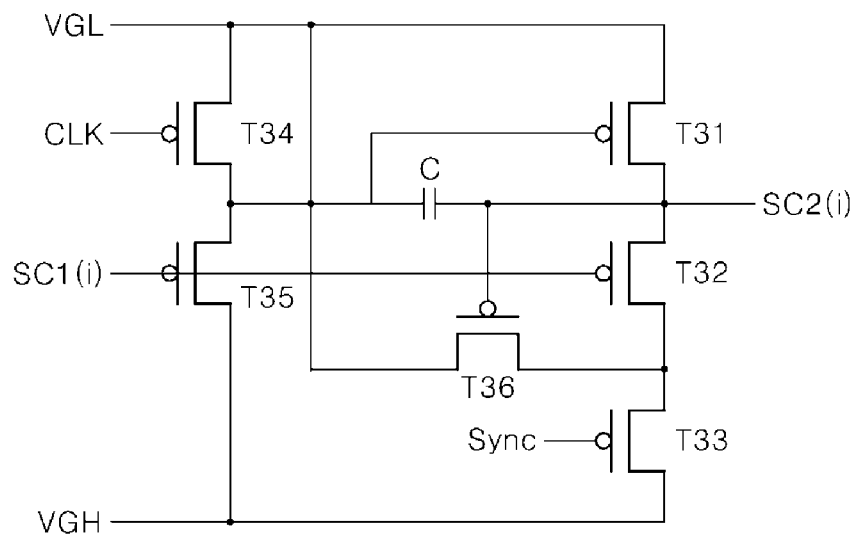
FIG. 15 is a diagram showing one example of the second signal block shown in FIG. 14.

FIG. 14 is a diagram showing first and second gate drive units according to the fourth aspect of the present disclosure. FIG. 15 is a diagram showing one example of the second signal block shown in FIG. 14.

As shown in FIG. 14, according to fourth aspect of the present disclosure, the second signal blocks 132*a'*, 132*b"* of the first and second gate drive units 13*a'*, 13*b"* receive the output signal from the first signal block 131 of the first gate drive unit 13*a'*, and generates the second drive control signal SC2 based on the output signal of the first signal block 131.

In the meantime, the separation distance between the second signal block 132*b"* of the second gate drive unit 13*b"* and the first signal block 131 is longer than the separation distance between the second signal block 132*a'* of the first gate drive unit 13*a'* and the first signal block 131 by the width of the display area AA. Therefore, the time needed for the output signal SC1 of the first signal block 131 to reach the second signal block 132*b"* of the second gate drive unit 13*b"* is delayed than the time needed to reach the second signal block 132*a'* of the first gate drive unit 13*a'*.

As a result, the second signal blocks 132*a'*, 132*b"* of the first and second gate drive units 13*a'*, 13*b"* can possibly output the second drive control signals SC2 at different time points.

In order to prevent this, according to the fourth aspect of the present disclosure, the second signal blocks 132*a'*, 132*b"* of the first and second gate drive units 13*a'*, 13*b"* output the second drive control signal SC2 based on a predetermined synchronization signal.

That is, as shown in FIG. 15, the second signal blocks 132*a'*, 132*b"* of the first and second gate drive units 13*a'*, 13*b"* generates the second drive control signal SC2 based on the output signal SC1 of the first signal block 131 disposed in the first gate drive unit 13*a'* and the predetermined clock signal clk, and outputs the second drive control signal SC2 based on the predetermined synchronization signal Sync.

As shown in FIG. 15, each of the second signal blocks 132*a'*, 132*b"* of the first and second gate drive units 13*a'*, 13*b"* includes first, second and third buffer transistors T31, T32, T33 disposed in series between first and second gate driving power sources VGH, VGL, and fourth and fifth buffer transistors T34, T35 disposed in series between the first and second gate driving power sources VGH, VGL.

Here, the fourth buffer transistor T34 is turned on based on the clock signal clk and the fifth buffer transistor T35 is turned on based on the output signal SC1(*i*) of the first signal block 131.

And, the first buffer transistor T31 is turned on based on the charged voltage of the capacitor C, which is connected with a node between the fourth and fifth buffer transistors T34, T35, and the second buffer transistor T32 is turned on based on the output signal SC1(*i*) of the first signal block 131.

Also, the third buffer transistor T33 is turned on based on the synchronization signal Sync.

Each of the second signal blocks 132*a'*, 132*b"* of the first and second gate drive units 13*a'*, 13*b"* generates the output signal SC1(*i*) of the first signal block 131 according to the predetermined clock signal clk for generating the second drive control signal, and outputs the second drive control signal SC2(*i*) based on the synchronization signal Sync.

As a result, the second signal blocks 132*a'*, 132*b"* of the first and second gate drive units 13*a'*, 13*b"* can output the second drive control signal SC2(*i*) at the time point corresponding to the synchronization signal Sync. Therefore, since the second signal blocks 132*a'*, 132*b"* generate the second drive control signal based on the output signal SC1(*i*) of the first signal block 131, the structure of the second signal blocks is simplified and the time points at which the second drive control signals SC2(*i*) are supplied to both sides of the respective horizontal lines can be synchronized.

The present disclosure as explained in the above is not limited to the described aspects and appended figures, and it will be apparent to the ordinary person in the related art that various substitutions, modification, and variations can be made without departing from the technical spirit of the present disclosure.

What is claimed is:

1. A display panel including a display area where an image is displayed and a non-display area outside the display area, comprising:
    a plurality of pixels corresponding to a plurality of pixel areas defined in the display area; and
    first and second gate drive units respectively disposed in a first outer area and a second outer area of the non-display area corresponding to both sides of the display area in a horizontal direction,
    wherein the first gate drive unit disposed in the first outer area includes a first signal block supplying a first drive control signal to pixels arranged successively in the horizontal direction among the plurality of pixels and a second signal block supplying a second drive control signal having pulses different from those of the first drive control signal to the pixels arranged successively in the horizontal direction, and
    wherein the second gate drive unit disposed in the second outer area includes the second signal block and a third signal block supplying a third drive control signal having pulses different from those of the first and second drive control signals to the pixels arranged successively in the horizontal direction.

2. The display panel of claim 1, wherein the first and second drive control signals are supplied at respective turn-on levels during a predetermined period by the first and second signal blocks, wherein the second drive control signal is changed to a turn-off level earlier than the first drive control signal before the predetermined period expires.

3. The display panel of claim 2, wherein the third drive control signal is supplied at the turn-off level during the predetermined period.

4. The display panel of claim 1, wherein one pixel of the plurality of pixels which is disposed in an $i^{th}$ horizontal line (where i is a natural number greater than or equal to 1 and smaller than or equal to N, where N is the number of the horizontal lines) comprises:
- an organic light emitting device;
- a first thin film transistor connected in series with the organic light emitting device between a first driving source line and a second driving source line, wherein the first driving source line supplies a first driving source to the plurality of pixels and the second driving source line supplies a second driving source to the plurality of pixels, and the second driving source is lower than the first driving source;
- a second thin film transistor disposed between a first node and a second node, wherein the first node is connected with one of the first and second electrodes of the first thin film transistor corresponding to the first driving source line, and the second node is connected with a gate electrode of the first thin film transistor;
- a storage capacitor disposed between the second node and a third node, which is connected with an anode electrode of the organic light emitting device;
- a third thin film transistor disposed between the third node and an initialization source line supplying an initialization source to the plurality of pixels;
- fourth and fifth thin film transistors disposed between a data line supplying a data signal to the plurality of pixels and a fourth node connected with the other of the first and second electrodes of the first thin film transistor;
- a sixth thin film transistor disposed between the fourth node and the organic light emitting device; and
- a seventh thin film transistor disposed between the first driving source line and the first node.

5. The display panel of claim 4, wherein the second thin film transistor is made in a conduction type different from those of the third, fourth, fifth, sixth, and seventh thin film transistors,
wherein the second thin film transistor is turned on based on an $i^{th}$ sampling scan signal,
wherein the third thin film transistor is turned on based on an $i^{th}$ switching scan signal,
wherein one of the fourth and fifth thin film transistors is turned on based on the $i^{th}$ switching scan signal while the other is turned on based on an $i+1^{th}$ switching scan signal, and
wherein one of the first and second drive control signals is a sampling scan signal for the respective horizontal lines, while the other is a switching scan signal for the respective horizontal lines.

6. The display panel of claim 5, wherein, during a period when the data signal is supplied to the one pixel, the $i^{th}$ sampling scan signal and the $i^{th}$ switching scan signal are supplied at respective turn-on levels,
wherein, before the period when the data signal is supplied is expired, the $i^{th}$ sampling scan signal is changed to the turn-off level earlier than the $i^{th}$ switching scan signal, wherein the first signal block supplies switching scan signals for the pixels arranged successively in the horizontal direction, and
wherein the second signal block supplies sampling scan signals for the pixels arranged successively in the horizontal direction.

7. The display panel of claim 6, wherein, during a period when the data signal is supplied to the one pixel, the $i^{th}$ sampling scan signal and the $i^{th}$ switching scan signal are supplied at turn-on levels,
wherein, before the period when the data signal is supplied is expired, the $i^{th}$ switching scan signal is changed to the turn-off level earlier than the $i^{th}$ sampling scan signal,
wherein the first signal block supplies sampling scan signals for the pixels arranged successively in the horizontal direction, and
wherein the second signal block supplies switching scan signals for the pixels arranged successively in the horizontal direction.

8. The display panel of claim 5, wherein the sixth thin film transistor is turned on based on an $i^{th}$ emission signal,
wherein the seventh thin film transistor is turned on based on an $i+1^{th}$ emission signal, and
wherein a third drive control signal supplied by the third signal block is an emission signal for the pixels arranged successively in the horizontal direction.

9. The display panel of claim 8, wherein the third signal block of the second gate drive unit is disposed in an area smaller than that for the first signal block of the first gate drive unit, and
wherein the second signal block of the second gate drive unit is disposed in an area greater than that for the second signal block of the first gate drive unit.

10. The display panel of claim 9, wherein the second signal block includes buffer units which correspond to the pixels arranged successively in the horizontal direction, and
wherein the buffer unit of the second signal block of the second gate drive unit is disposed in an area greater than that for the buffer unit of the second signal block of the first gate drive unit.

11. The display panel of claim 10, wherein the buffer unit includes first and second buffer transistors which are connected in series between a first gate driving source and a second gate driving source lower than the first gate driving source, and
wherein the first and second buffer transistors provided in the second signal block of the second gate drive unit have channel widths wider than those of the first and second buffer transistors provided in the second signal block of the first gate drive unit.

12. The display panel of claim 5, wherein the second signal block of each of the first and second gate drive units inverts an output signal of the first signal block according to a predetermined clock signal for generating a second drive control signal to generate the second drive control signal, and outputs the second drive control signal to the pixels arranged successively in the horizontal direction based on a predetermined synchronization signal.

13. A display panel, comprising:
- a display area where a plurality of pixels is successively disposed in a horizontal direction and first and second non-display areas outside the display area, wherein the first and second non-display areas disposed at a side opposite to each other with respect to the display area;
- a first gate drive unit disposed in the first non-display area and including a first signal block supplying a first drive control signal to the pixels arranged successively in the horizontal direction and a second signal block supplying a second drive control signal having pulses different from those of the first drive control signal to the plurality of pixels; and a second gate drive unit disposed in the second non-display area and including the second signal block and a third signal block supplying a third drive control signal having pulses different from those of the first and second drive control signals to the plurality of pixels.

14. The display panel of claim 13, wherein the first and second drive control signals are supplied at respective turn-on levels during a predetermined period by the first and second signal blocks, wherein the second drive control signal is changed to a turn-off level earlier than the first drive control signal before the predetermined period expires.

15. The display panel of claim 14, wherein the third drive control signal is supplied at the turn-off level during the predetermined period.

16. The display panel of claim 13, wherein the plurality of pixels having one pixel disposed in an $i^{th}$ horizontal line, where i is a natural number greater than or equal to 1 and smaller than or equal to N, and N is the number of the horizontal lines, and the one pixel includes:

an organic light emitting device;

a first thin film transistor connected in series with the organic light emitting device between a first driving source line and a second driving source line, wherein the first driving source line supplies a first driving source to the plurality of pixels and the second driving source line supplies a second driving source to the plurality of pixels, and the second driving source is lower than the first driving source;

a second thin film transistor disposed between a first node and a second node, wherein the first node is connected with one of the first and second electrodes of the first thin film transistor corresponding to the first driving source line, and the second node is connected with a gate electrode of the first thin film transistor;

a storage capacitor disposed between the second node and a third node, which is connected with an anode electrode of the organic light emitting device;

a third thin film transistor disposed between the third node and an initialization source line supplying an initialization source to the plurality of pixels;

fourth and fifth thin film transistors disposed between a data line supplying a data signal to the plurality of pixels and a fourth node connected with the other of the first and second electrodes of the first thin film transistor;

a sixth thin film transistor disposed between the fourth node and the organic light emitting device; and a seventh thin film transistor disposed between the first driving source line and the first node.

17. The display panel of claim 16, wherein the second thin film transistor is made in a conduction type different from those of the third, fourth, fifth, sixth, and seventh thin film transistors, wherein the second thin film transistor is turned on based on an $i^{th}$ sampling scan signal, wherein the third thin film transistor is turned on based on an $i^{th}$ switching scan signal, wherein one of the fourth and fifth thin film transistors is turned on based on the $i^{th}$ switching scan signal while the other is turned on based on an $i+1^{th}$ switching scan signal, and wherein one of the first and second drive control signals is a sampling scan signal for the respective horizontal lines, while the other is a switching scan signal for the respective horizontal lines.

18. The display panel of claim 17, wherein, during a period when the data signal is supplied to the one pixel, the $i^{th}$ sampling scan signal and the $i^{th}$ switching scan signal are supplied at respective turn-on levels, wherein, before the period when the data signal is supplied is expired, the $i^{th}$ sampling scan signal is changed to the turn-off level earlier than the $i^{th}$ switching scan signal, wherein the first signal block supplies switching scan signals for the plurality of pixels, and wherein the second signal block supplies sampling scan signals for the plurality of pixels.

19. The display panel of claim 18, wherein, during a period when the data signal is supplied to the one pixel, the $i^{th}$ sampling scan signal and the $i^{th}$ switching scan signal are supplied at turn-on levels, wherein, before the period when the data signal is supplied is expired, the $i^{th}$ switching scan signal is changed to the turn-off level earlier than the $i^{th}$ sampling scan signal, wherein the first signal block supplies sampling scan signals for the plurality of pixels, and wherein the second signal block supplies switching scan signals for the plurality of pixels.

20. The display panel of claim 17, wherein the sixth thin film transistor is turned on based on an $i^{th}$ emission signal, wherein the seventh thin film transistor is turned on based on an $i+1^{th}$ emission signal, and wherein a third drive control signal supplied by the third signal block is an emission signal for the plurality of pixels.

21. The display panel of claim 20, wherein the third signal block of the second gate drive unit is disposed in an area smaller than that for the first signal block of the first gate drive unit, and wherein the second signal block of the second gate drive unit is disposed in an area greater than that for the second signal block of the first gate drive unit.

22. The display panel of claim 21, wherein the second signal block includes buffer units which correspond to the pixels, and wherein the buffer unit of the second signal block of the second gate drive unit is disposed in an area greater than that for the buffer unit of the second signal block of the first gate drive unit.

23. The display panel of claim 22, wherein the buffer unit includes first and second buffer transistors which are connected in series between a first gate driving source and a second gate driving source lower than the first gate driving source, and wherein the first and second buffer transistors provided in the second signal block of the second gate drive unit have channel widths wider than those of the first and second buffer transistors provided in the second signal block of the first gate drive unit.

24. The display panel of claim 17, wherein the second signal block of each of the first and second gate drive units inverts an output signal of the first signal block according to a predetermined clock signal for generating a second drive control signal to generate the second drive control signal, and outputs the second drive control signal to the plurality of pixels based on a predetermined synchronization signal.

* * * * *